(12) United States Patent
Lin et al.

(10) Patent No.: US 12,147,114 B2
(45) Date of Patent: Nov. 19, 2024

(54) DISPLAY DEVICE

(71) Applicant: InnoLux Corporation, Miao-Li County (TW)

(72) Inventors: Hsiao-Lang Lin, Miao-Li County (TW); Tsung-Han Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/076,303

(22) Filed: Dec. 6, 2022

(65) Prior Publication Data

US 2023/0107527 A1 Apr. 6, 2023

Related U.S. Application Data

(63) Continuation of application No. 16/713,004, filed on Dec. 13, 2019, now Pat. No. 11,544,952, which is a continuation of application No. 15/719,600, filed on Sep. 29, 2017, now Pat. No. 10,546,203.

(60) Provisional application No. 62/512,733, filed on May 31, 2017, provisional application No. 62/527,198, filed on Jun. 30, 2017.

(51) Int. Cl.
| | | |
|---|---|---|
| *G02F 1/1335* | (2006.01) | |
| *G02F 1/1333* | (2006.01) | |
| *G02F 1/13357* | (2006.01) | |
| *G06V 10/143* | (2022.01) | |
| *G06V 40/10* | (2022.01) | |
| *G06V 40/12* | (2022.01) | |
| *G06V 40/13* | (2022.01) | |
| *H10K 59/00* | (2023.01) | |
| *H10K 59/35* | (2023.01) | |

(52) U.S. Cl.
CPC .. *G02F 1/133514* (2013.01); *G02F 1/133603* (2013.01); *G02F 1/133617* (2013.01); *G06V 10/143* (2022.01); *G06V 40/10* (2022.01); *G02F 1/1333* (2013.01); *G02F 1/13338* (2013.01); *G02F 1/133614* (2021.01); *G02F 2201/52* (2013.01); *G02F 2202/36* (2013.01); *G06V 40/12* (2022.01); *G06V 40/13* (2022.01); *G06V 40/1329* (2022.01); *H10K 59/00* (2023.02); *H10K 59/35* (2023.02)

(58) Field of Classification Search
None
See application file for complete search history.

(56) References Cited

U.S. PATENT DOCUMENTS

| | | | | |
|---|---|---|---|---|
| 4,678,285 A | * | 7/1987 | Ohta | H04N 3/127 348/E3.015 |
| 2005/0225707 A1 | * | 10/2005 | Seo | G02F 1/133509 349/122 |
| 2006/0039152 A1 | * | 2/2006 | Ito | G02F 1/133617 362/318 |

FOREIGN PATENT DOCUMENTS

| | | |
|---|---|---|
| CN | 1737668 A | 2/2006 |
| CN | 103676220 A | 3/2014 |

* cited by examiner

*Primary Examiner* — Lucy P Chien
(74) *Attorney, Agent, or Firm* — Winston Hsu

(57) ABSTRACT

A display device includes a display unit emitting an output light that has an output spectrum corresponding to a highest gray level of the display device. A maximum peak of the output spectrum between 380 nm and 493 nm is defined as a first intensity peak. A secondary peak of the output spectrum between 380 nm and 493 nm is defined as a second intensity peak. A first sub-peak ratio of the second intensity peak to the first intensity peak is in a range from 7.0% to 75.0%.

20 Claims, 20 Drawing Sheets

DISPLAY DEVICE

CROSS REFERENCE TO RELATED APPLICATIONS

This application is a continuation application of U.S. application Ser. No. 16/713,004, filed on Dec. 13, 2019, which is a continuation application of U.S. application Ser. No. 15/719,600, filed on Sep. 29, 2017, which claims the benefit of U.S. Provisional Application No. 62/512,733, filed on May 31, 2017, and claims the benefit of U.S. Provisional Application No. 62/527,198, filed on Jun. 30, 2017. The contents of these applications are incorporated herein by reference.

BACKGROUND OF THE DISCLOSURE

1. Field of the Disclosure

The present disclosure relates to a display device, and more particularly to a display device with high color gamut.

2. Description of the Prior Art

Nowadays, display devices have advantages of portability, low power consumption, and low radiation. Therefore, they are widely used in various information products, such as desktop computers, notebooks, smart phones, car displays and head up displays.

In general, the output spectrum of green light produced by a display device is designed to have a higher peak and smaller full width at half maximum (FWHM), such as smaller than 40 nm, so as to provide more pure green light for meeting the requirement of ultra-high-definition standard of Rec. 2020 in high color gamut application. However, this design decreases the perception of M size cone cells of human eye for green light. Accordingly, it is an issue for manufacturers to develop a display device with the emitted green light that can be close to or meet the Rec. 2020 standard and provide high perception to the M size cone cells at the same time.

SUMMARY OF THE DISCLOSURE

According to an embodiment, a display device is provided by the present disclosure. The display device includes a display unit emitting an output light that has an output spectrum corresponding to a highest gray level of the display device. A maximum peak of the output spectrum between 380 nm and 493 nm is defined as a first intensity peak, a secondary peak of the output spectrum between 380 nm and 493 nm is defined as a second intensity peak, and a first sub-peak ratio of the second intensity peak to the first intensity peak is in a range from 7.0% to 75.0%.

According to an embodiment, a display device is provided by the present disclosure. The display device includes a display unit emitting an output light that has an output spectrum corresponding to a highest gray level of the display device. A secondary maximum intensity of the output spectrum between 380 nm and 493 nm is defined as a first intensity value, a maximum intensity of the output spectrum between 576 nm and 780 nm is defined as a second intensity value, a third sub-peak ratio of the first intensity value to the second intensity value is in a range from 12.0% to 89.0%.

According to an embodiment, a display device is provided by the present disclosure. The display device includes a display unit emitting an output light having an output spectrum corresponding to a highest gray level of the display device, wherein an intensity integral of the output spectrum from 494 nm to 575 nm is defined as a first intensity integral, an intensity integral of the output spectrum from 380 nm to 493 nm is defined as a second intensity integral, an intensity integral of the output spectrum from 576 nm to 780 nm is defined as a third intensity integral, a summation of the second intensity integral and the third intensity integral is defined as a first summation, a ratio of the first summation to the first intensity integral is defined as a first ratio, and the first ratio is greater than 0.0% and less than or equal to 37.0%.

According to an embodiment, a display device is provided by the present disclosure. The display device includes a display unit emitting an output light having an output spectrum corresponding to a highest gray level of the display device. A maximum peak of the output spectrum between 494 nm and 575 nm is defined as a first intensity peak, and a maximum peak of the output spectrum between 380 nm and 493 nm is defined as a second intensity peak. A ratio of the second intensity peak to the first intensity peak is defined as a fourth ratio, and the fourth ratio is greater than or equal to 1.0% and less than or equal to 15.0%.

These and other objectives of the present disclosure will no doubt become obvious to those of ordinary skill in the art after reading the following detailed description of the embodiment that is illustrated in the various figures and drawings.

DETAILED DESCRIPTION

Figure 1:
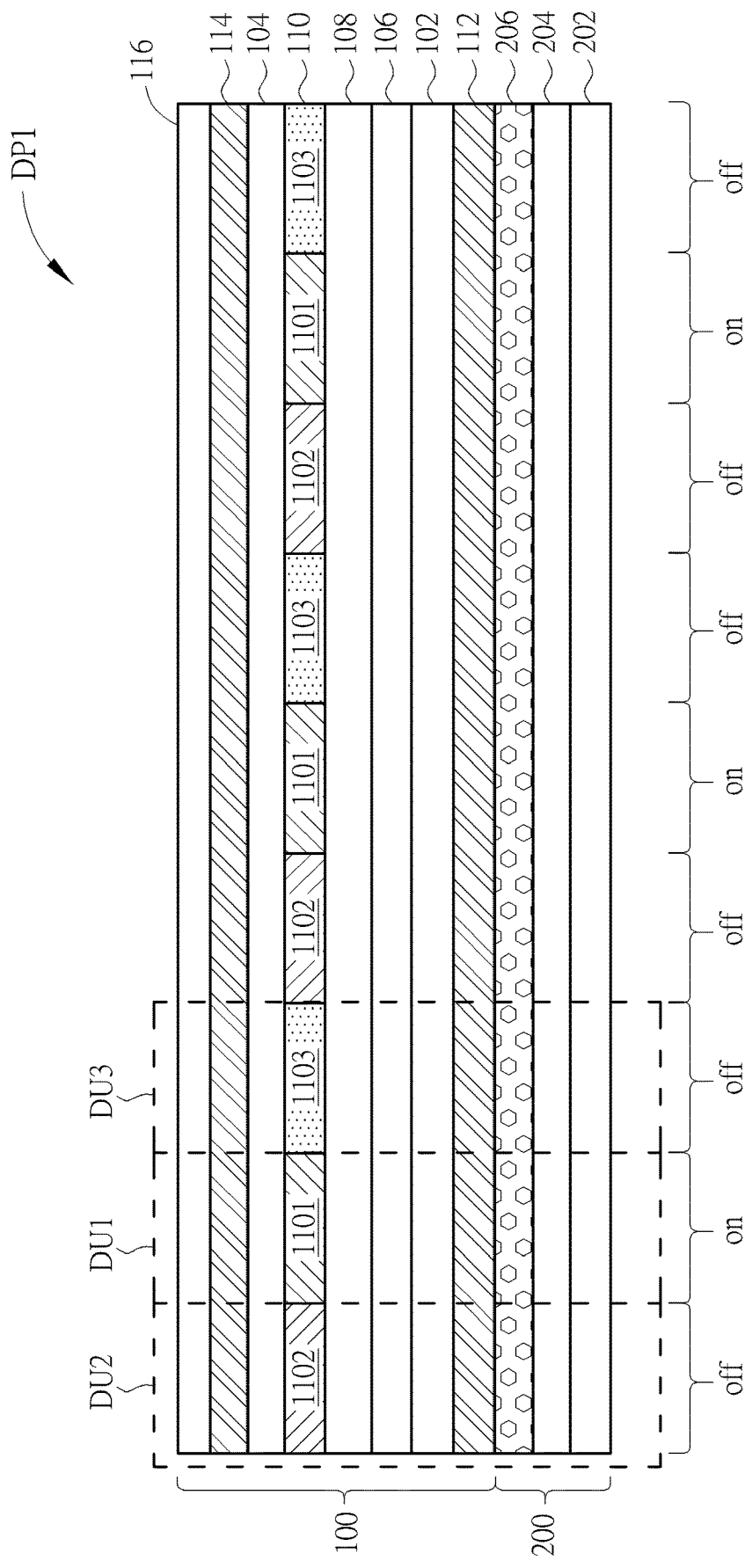
FIG. 1 is a schematic diagram of a cross-sectional view of a display device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the touch display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ".

When the corresponding component such as layer or area is referred to "on another component (or the variant thereof)" or "extend to another component", it may be directly on another component or directly extend to another component, or other component may exist between them. On the other hand, when the component is referred to "directly on another component (or the variant thereof)" or "directly extend to another component", any component does not exist between them. In addition, when the component is referred to "be coupled to/with another component (or the variant thereof)", it may be directly connected to another component, or may be indirectly connected (such as electrically connected) to another component through other component or components.

It will be understood that when an element or layer is referred to as being "on" or "connected to" another element or layer, it can be directly on or directly connected to the other element or layer, or intervening elements or layers (indirectly) may be presented. In contrast, when an element is referred to as being "directly on" or "directly connected to" another element or layer, there are no intervening elements or layers presented.

When the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

It should be noted that the technical features in different embodiments described in the following can be replaced, recombined, or mixed with one another to constitute another embodiment without departing from the spirit of the present disclosure.

In the disclosure, display units of a display device are sub-pixels or pixels for displaying image to the observer in all embodiments. Each display units is a stacked structure which comprises all related layers, elements or parts that are configured to emit light with brightness and color. For liquid crystal display device, the display units are sub-pixels, and each display unit may comprise related part of liquid crystal layer, related part of polarizer(s), related part of backlight, related substrate(s) and driving circuit, and related color filter for instance. For self-luminous display device (such as LED and OLED), the display units are sub-pixels or pixels, and each display unit may comprise related self-emitting source, related light converting layer, related part of optical film(s), and related substrate (s) and driving circuit. In addition, several display units may have a common layer, a common element, or a common part.

In the disclosure, the output light is a final optical result from the display unit (or the display units) of the display device to the eyes of the observer (user) in all embodiments. The measurement of output spectrum of output light should be measured out of the display device and corresponding to a highest gray level of specific display unit(s) of the display device, which means the output spectrum of the output light produced by the display unit is measured when the specific display unit(s) is (are) in an operation of the greatest gray level by driving the corresponding circuit with a highest driving voltage for example.

Figure 2:
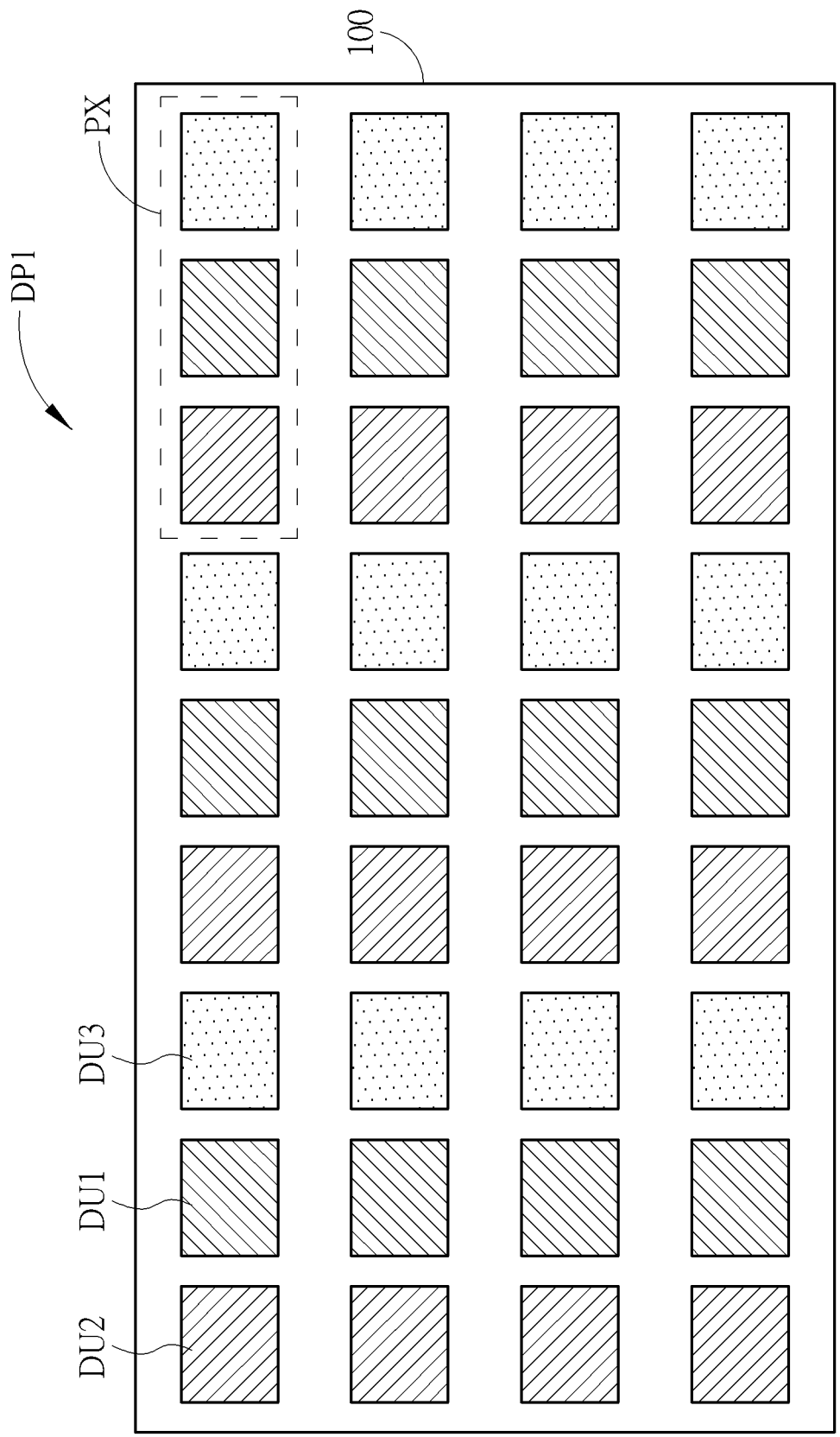
FIG. 2 is a top-view schematic diagram of an arrangement of the display units of the sub-pixels of the display device according to the first embodiment of the present disclosure.
Figure 3:
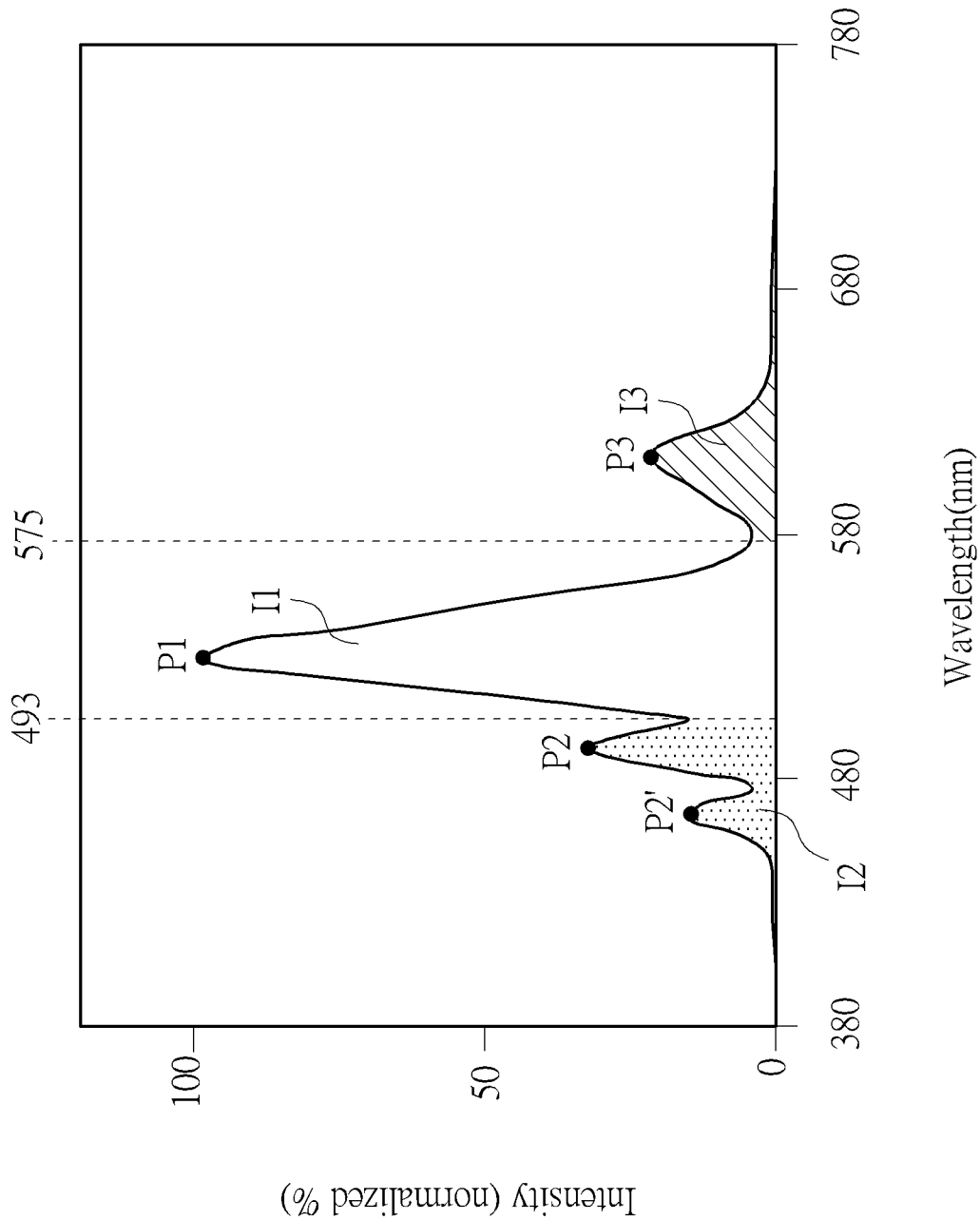
FIG. 3 is a schematic diagram of the output spectrum of one of the display units of the display device according to the first embodiment of the present disclosure.

Referring to FIG. 1 to FIG. 3, FIG. 1 is a schematic diagram of a cross-sectional view of a display device according to a first embodiment of the present disclosure, FIG. 2 is a schematic diagram of a top view (plan view) of an arrangement of the display units of the sub-pixels of the display device according to the first embodiment of the present disclosure, and FIG. 3 is a schematic diagram of the output spectrum of one of the display units of the display device according to the first embodiment of the present disclosure. According to the present disclosure, the display device DP1 includes at least one display unit DU1. In this embodiment, the display device DP1 may selectively include at least one display unit DU2 and at least one display unit DU3 for emitting light with spectrum not identical to that of the display unit DU1. Specifically, the light emitted by the display unit DU1, the light emitted by the display unit DU2, and the light emitted by the display unit DU3 have different spectrums respectively. As shown in FIG. 1 and FIG. 2, the display device DP1 of this embodiment includes a plurality of display units DU1, a plurality of display units DU2 and a plurality of display units DU3 alternately arranged side by side. In addition, one of the display units DU1, one of the display units DU2 and one of the display units DU3 form a pixel PX, and the display unit DU1 is disposed between the display unit DU2 and the display unit DU3 in each pixel PX, but the arrangement of the display units is not limited thereto.

Each of the display units DU1, the display units DU2 and the display units DU3 is composed of several elements respectively, and their structures are introduced below in detail. In this embodiment, the display device DP1 is a liquid crystal display device for example. The display device DP1 substantially includes a display panel 100 and a backlight module 200. The display panel 100 includes a first substrate 102, a second substrate 104 disposed opposite to the first substrate 102, a display circuit array 106 for driving, a light modulating layer 108, and at least one light converting layer 110, wherein the side of the second substrate 104 opposite to the first substrate 102 is the display side of the display device DP1. The display panel 100 of this embodiment may further include a first polarizer 112 and a second polarizer 114. The display circuit array 106, the light modulating layer 108, and the light converting layer 110 are disposed between the first substrate 102 and the second substrate 104. In the embodiment, the light modulating layer 108 could be dispose between the display circuit array 106 and the light converting layer 110. In other embodiments, the display circuit array 106 could be disposed between the light modulating layer 108 and the light converting layer 110, or the light converting layer 110 could be disposed between the light modulating layer 108 and the display circuit array 106. The first polarizer 112 is at a side of the first substrate 102 opposite to the second substrate 104, and the second polarizer 114 is at a side of the second substrate 104 opposite to the first substrate 102. Selectively, an optical film 116 may be further disposed on the first polarizer 112 or the second polarizer 114. In addition, the display device DP1 may further include other elements and layers not shown in FIG. 1, e.g., insulating layer, alignment layer, or sealing layer. The first substrate 102 and the second substrate 104 may be a hard substrate such as a glass substrate, a plastic substrate, a quartz substrate or a sapphire substrate, or may be a flexible substrate such as polyimide (PI) or polyethylene terephthalate (PET), but not limited thereto. The display circuit array 106 is disposed on the first substrate 102 and may include, but not limited to, transistors, gate lines, data lines, common lines, electrodes, capacitors, wirings or other driving elements and parts for instance.

The light modulating layer 108 is disposed on the display circuit array 106 and disposed between the first substrate 102 and the second substrate 104. The light modulating layer 108 is utilized for controlling the gray level (or the light intensity) of light emitted from the backlight module 200. Since the display device DP1 of this embodiment is a liquid crystal display device, the light modulating layer 108 may be a liquid crystal layer and include a plurality of liquid crystal molecules, or one of birefringence materials, but not limited thereto.

In the embodiment, the light converting layer 110 is disposed between the light modulating layer 108 and the second substrate 104 for converting or adjusting the spectrum or color of the light emitted from the backlight module 200 and passing through the light modulating layer 108. The light converting layer 110 of this embodiment includes first converting units 1101, second converting units 1102 and third converting units 1103 alternately arranged side by side, wherein these converting units may include color filter material, quantum dot material, phosphor material, pigment material or a combination of two or more of the above-mentioned materials. The lights emitted out of the first converting units 1101, the second converting units 1102 and the third converting units 1103 respectively have different spectrum or color, and therefore the materials included by the first converting units 1101, the second converting units 1102 and the third converting units 1103 may be non-identical. Each of the first converting units 1101, the second converting units 1102 and the third converting units 1103 is corresponding to one of the display units. In this embodiment, for example, one of the first converting units 1101 is corresponding to one of the display units DU1 and may convert the light emitted from the backlight module 200 into green light that has a spectrum with a maximum peak between 495 nm and 570 nm of wavelength, one of the second converting units 1102 is corresponding to one of the display units DU2 and may convert the light emitted from the backlight module 200 into blue light that has a spectrum with a maximum peak between 450 nm and 475 nm of wavelength, and the third converting units 1103 is corresponding to one of the display units DU3 and may convert the light emitted from the backlight module 200 into red light that has a spectrum with a maximum peak between 620 nm and 750 nm of wavelength. For example, the first converting units 1101, the second converting units 1102, and the third converting units 1103 include green color filters, blue color filters, and red color filters respectively, and the display units DU1, the display units DU2, and the display units DU3 respectively represent the green sub-pixels, the blue sub-pixels, and the red sub-pixels. Therefore, one pixel PX is composed of one of the display units DU1, one of the display units DU2, and one of the display units DU3, but not limited thereto. In some embodiments, the numbers of these different sub-pixels may be non-identical.

The backlight module 200 is disposed adjacent to the first polarizer 112. The backlight module 200 of this embodiment produces white light that propagates to the display panel 100. In this embodiment, the backlight module 200 includes a light emitting diode (LED), a backlight unit 202, an optional optical film 204 disposed on the backlight unit 202, and a light converting layer 206 disposed on the optical film 204, wherein the backlight unit 202 produces blue light, and the light converting layer 206 may include quantum dot material for instance used for converting the blue light emitted from the backlight unit 202 into white light, but not limited thereto. In other embodiments, the backlight unit 202 may produce white light and the light converting layer 206 is not required. For example, the backlight unit 202 may include one or more white light source(s), or may include three types of light sources emitting different color lights (such as red light, green light and blue light) to compose the white light.

In this embodiment, each of the display units DU1 includes a portion of the backlight module 200 and a portion of the display panel 100. Specifically, each display unit DU1 includes a portion of the first substrate 102, a portion of the display circuit array 106, a portion of the light modulating layer 108, a portion of the light converting layer 110 (i.e. one of the first converting units 1101), a portion of the second substrate 104, and other related elements, films or layers, as shown in FIG. 1. Similarly, each display unit DU2 includes a portion of the backlight module 200, a portion of the first substrate 102, a portion of the display circuit array 106, a portion of the light modulating layer 108, a portion of the light converting layer 110 (i.e. one of the second converting units 1102), a portion of the second substrate 104, and other related elements, films or layers, and each display unit DU3 includes a portion of the backlight module 200, a portion of the first substrate 102, a portion of the display circuit array 106, a portion of the of the light modulating layer 108, a portion of the light converting layer 110 (i.e. one of the third converting units 1103), and other related elements, films or layers. An output light could be regarded as the final visual light of each display unit DU1, DU2, or DU3 of the display device to the observer (user), and an output spectrum of the output light is measured out of the display device.

As mentioned above, the first converting units 1101 are used for converting the light (input light) emitted from the backlight module 200 into the output light having a maximum peak of the spectrum corresponding to a wavelength for example ranging from 494 nm to 575 nm. It should be noted that the first converting units 1101 may include color adjusting material (such as quantum dot material or pigment material) for making the output spectrum of the output light have at least one peak at a wavelength ranging from 380 nm to 493 nm or from 576 nm to 780 nm. As shown in FIG. 1 and FIG. 3, one of the display units DU1 of the display device DP1 can emit an output light having an output spectrum corresponding to a highest gray level of the display device DP1, which means the output light of the display unit DU1 is produced when the display unit DU1 is under an operation of the highest gray level. For example, the display unit DU1 is driven by a highest operation voltage, but not limited thereto. In the output spectrum of the output light of the display DU1, an intensity integral of the output spectrum from 494 nm to 575 nm is defined as a first intensity integral I1, an intensity integral of the output spectrum from 380 nm to 493 nm is defined as a second intensity integral I2, an intensity integral of the output spectrum from 576 nm to 780 nm is defined as a third intensity integral I3. According to the present disclosure, a summation of the second intensity integral I2 and the third intensity integral I3 is defined as a first summation, a ratio of the first summation to the first intensity integral I1 is defined as a first ratio, and the first ratio is designed to be greater than 0.0% and less than or equal to 37.0%. In this embodiment, the second intensity integral I2 and the third intensity integral I3 are both greater than 0 due to the design of the first converting unit 1101, as mentioned above. However, in other embodiments, one of the second intensity integral I2 and the third intensity integral I3 may be 0 provided that at least one of the second intensity integral I2 and the third intensity integral I3 is greater than 0 and the first ratio is not greater than 37.0%. It should be noted the output spectrum shown in FIG. 3 is measured when the display units DU1 of the display device DP1 are operated under a highest gray level while the display units DU2 and the display units DU3 are operated under a lowest gray level. In other words, during the measurement, the display units DU1 of the display device DP1 are turned on, the display units DU2 and the display units DU3 are all turned off, as the illustration in FIG. 1. In addition, a maximum peak of the output spectrum between 494 nm to 575 nm is defined as a first intensity peak P1, a maximum peak of the output spectrum between 380 nm and 493 nm is defined as a second intensity peak P2, and an optional secondary peak of the output spectrum between 380 nm and 493 nm may exist and is defined as a sub-second intensity peak P2'. Moreover, a maximum peak of the output spectrum between 576 nm and 780 nm also exists and is defined as a third intensity peak P3.

Figure 4:
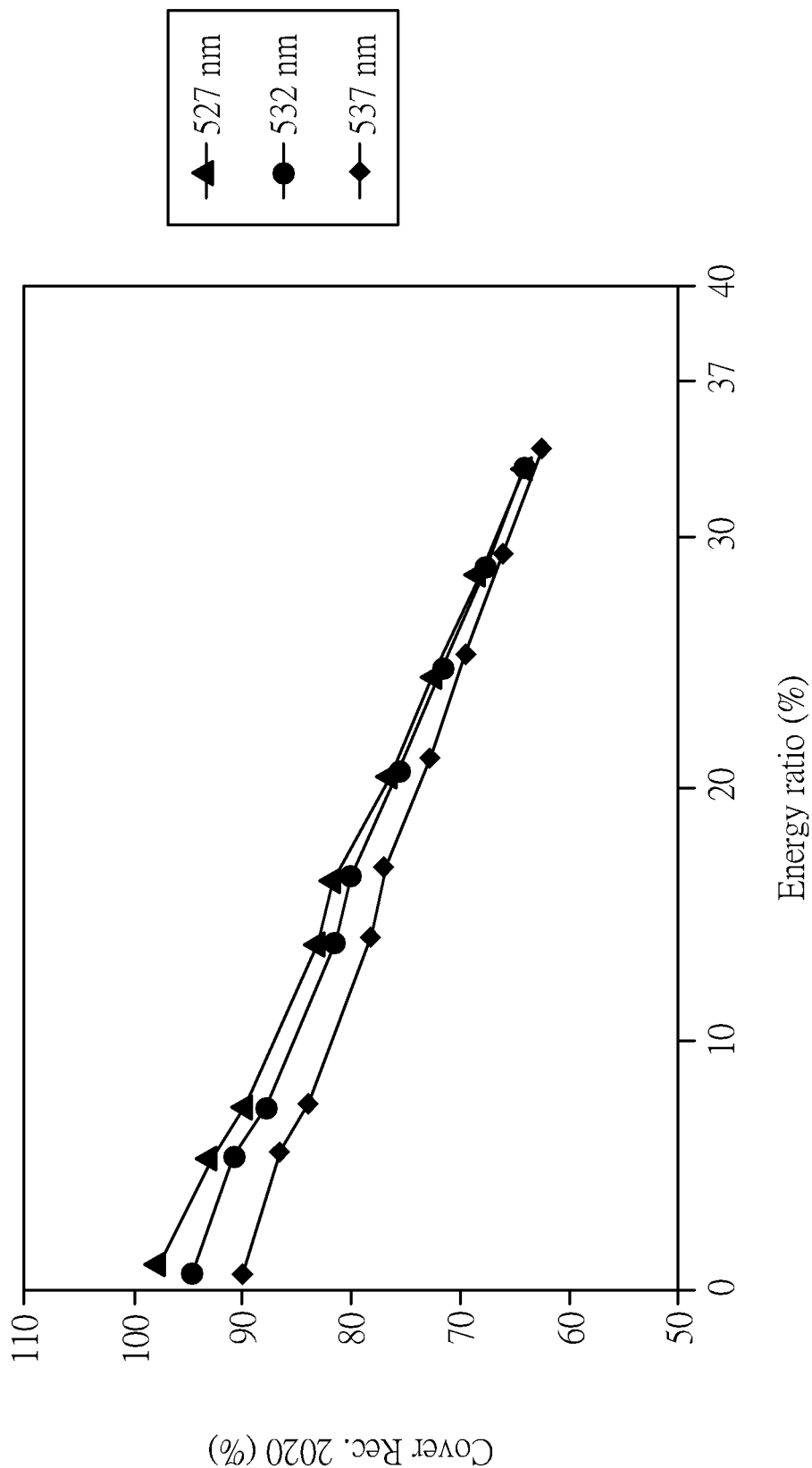
FIG. 4 is a curve diagram of Rec. 2020 coverage ratio versus the first ratio of the display units of the display device according to the present disclosure.

Referring to FIG. 4, FIG. 4 is a curve diagram of Rec. 2020 coverage ratio versus the first ratio of the display units DU1 of the display device DP1 according to the present disclosure, wherein the energy ratio of the x-coordinate represents the first ratio mentioned above, and the illustrated curves shows the measurements for Rec. 2020 coverage ratio of three examples of the present disclosure with the related output spectrums having the highest peak (the first intensity peak P1 shown in FIG. 3) at 527 nm, 532 nm, and 537 nm respectively. The Rec. 2020 coverage ratio chart is measured when the display units DU1 of the display device DP1 are operated under a highest gray level for producing pure green light. Still, during the measurements, the display units DU1 of the display device DP1 are turned on and driving by a highest driving voltage for example, while the display units DU2 and the display units DU3 are all turned off. According to the design of the first ratio of the display device DP1 of the present disclosure, the Rec. 2020 coverage ratio of the output spectrum of the output light of the display units DU1 is greater than or equal to 60%, thus the display units DU1 can meet the high color gamut requirement of the Rec. 2020 standard. As shown in FIG. 4, for the cases of the first intensity peak P1 having the same wavelength in one curve, the Rec. 2020 coverage ratio of the output spectrum of the output light of the display units DU1 is higher when the first ratio is lower; and for the case of the first intensity peak P1 having shorter wavelength among the three curves, the Rec. 2020 coverage ratio is higher, as the curve of 527 nm. In addition, when comparing the trending of the three curves in FIG. 4, one could understand that when the first ratio is closer to 37.0%, the values of the Rec. 2020 coverage ratio are approximate to each other among these examples, which means the influence on the Rec. 2020 coverage ratio due to the wavelength value of the highest peak in the output spectrum of the display units DU1 is reduced when the first ratio is close to 37.0%, while the differences of the Rec. 2020 coverage ratio between these examples are greater when the first ratio is closer to 0.0%. Accordingly, one of the advantages to design the first ratio to be closer to 37.0% is that the selection of the light source in the backlight unit 202 or the backlight module 200 can be more flexible because the wavelength parameter of the light source has less influence on the Rec. 2020 coverage ratio of the output light. However, according to the present disclosure, the first ratio is not required to be close to 37.0% as much as possible, and the display units DU1 having the output spectrum with the first ratio greater than 0.0% and less than or equal to 37.0% is one of the main design spirits in order to provide the output green light have a Rec. 2020 coverage ratio greater than 60% and near 100%.

Figure 5:
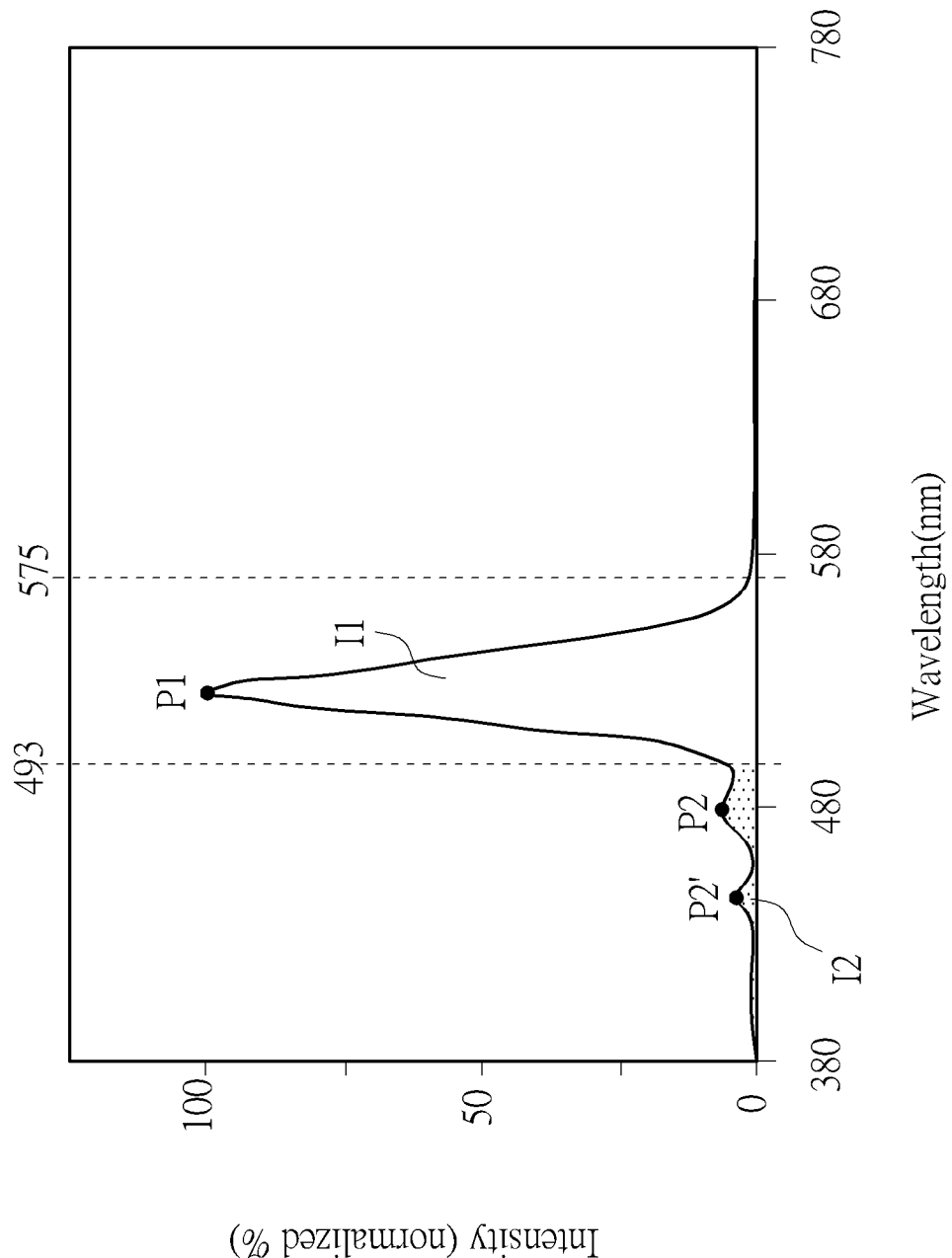
FIG. 5 is a schematic diagram of the output spectrum of one of the display units of the display device according to a variant embodiment of the first embodiment of the present disclosure.
Figure 6:
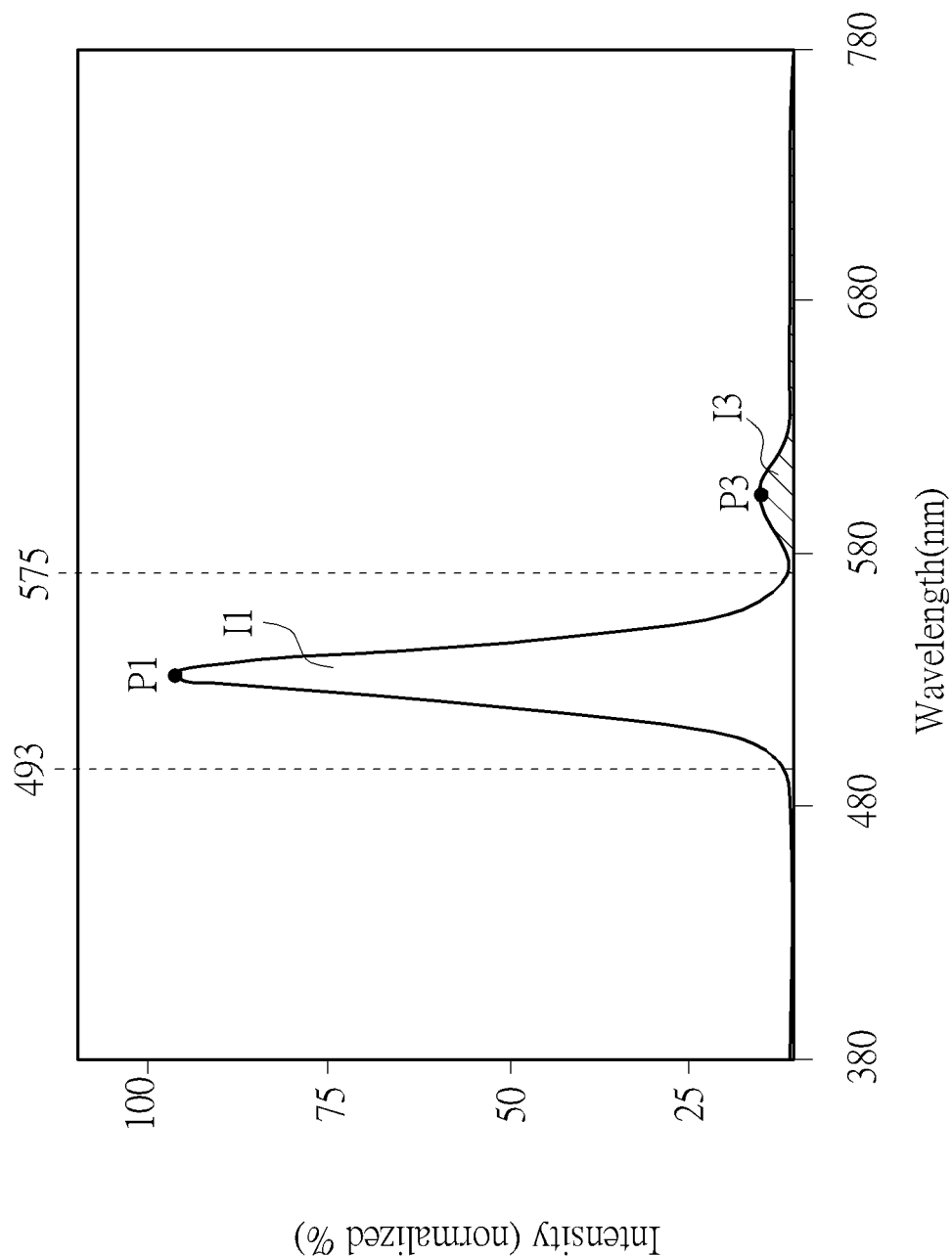
FIG. 6 is a schematic diagram of the output spectrum of one of the display units of the display device according to another variant embodiment of the first embodiment of the present disclosure.

Referring to FIG. 5 and FIG. 6, FIG. 5 is a schematic diagram of the respective output spectrums of the display units of the display device according to a variant embodiment of the first embodiment of the present disclosure, and FIG. 6 is a schematic diagram of the respective output spectrums of the display units of the display device according to another variant embodiment of the first embodiment of the present disclosure. Compared with FIG. 3 of the first embodiment, the output spectrum of the variant embodiment shown in FIG. 5 has the first intensity integral I1 and the second intensity integral I2 and the related first intensity peak P1, the second intensity peak P2, and the sub-second intensity peak P2'. However, the output spectrum shown in FIG. 5 nearly does not have the third intensity peak P3 in the wavelength range from 576 nm to 780 nm, or the third intensity integral I3 is approximate to 0. In this variant embodiment, the ratio of the second intensity integral I2 to the first intensity integral I1 is defined as a second ratio which is greater than 0.0% and less than 37.0%. In another aspect, the output spectrum of another variant embodiment shown in FIG. 6 has the first intensity peak P1, the third intensity peak P3, the first intensity integral I1, and the third intensity integral I3, but nearly does not have the second intensity peak P2 and the second intensity integral I2. In this variant embodiment shown in FIG. 6, the ratio of the third intensity integral I3 to the first intensity integral I1 is defined as a third ratio which is greater than 0.0% and less than 37.0%. In these various embodiments, when the display units DU1 are in the operation of the highest gray level, the Rec. 2020 coverage ratio of the output spectrum of the output light of the display units DU1 is still greater than or equal to 60%.

Referring back to FIG. 3 of the first embodiment, a main peak ratio is defined to be either the ratio of the second intensity peak P2 to the first intensity peak P1, or the ratio of the third intensity peak P3 to the first intensity peak P1. Specifically, the ratio of the second intensity peak P2 to the first intensity peak P1 is defined as a fourth ratio which is greater than or equal to 1.0% and less than or equal to 15.0% according to the present disclosure. In addition, a ratio of the third intensity peak P3 to the first intensity peak P1 is defined as a fifth ratio which is greater than or equal to 1.0% and less than or equal to 15.0% according to the present disclosure. Table 1 shows the data of main peak ratio for different samples OL-1 to OL-8 of this embodiment, wherein the first intensity peak P1 is at 527 nm, 528 nm, 529 nm, 530 nm, 531 nm, 532 nm, 533 nm, 534 nm, 535 nm, 536 nm or 537 nm. The value of the main peak ratio depends on the wavelength of the peaks, the characteristics of the light converting layer 110, the backlight module 200, even the first polarizer 112, the second polarizer 114, the optical film 116 and other elements of the display units DU1. All of these parameters may allow the main peak ratio vary in the range from 1.0% to 15.0%, or in the range from 3.0% to 14.5%.

TABLE 1

The Data of main peak ratio for different samples

| Main Peak ratio | Peak (nm) | | | | | | | | | | | Ave |
|---|---|---|---|---|---|---|---|---|---|---|---|---|
| (%) | 527 | 528 | 529 | 530 | 531 | 532 | 533 | 534 | 535 | 536 | 537 | (%) |
| OL-1 | 3.6 | 3.6 | 3.6 | 3.6 | 3.6 | 3.6 | 3.6 | 3.6 | 3.6 | 3.6 | 3.6 | 3.6 |
| OL-2 | 3.1 | 3.1 | 3.1 | 3.1 | 3.1 | 3.2 | 3.2 | 3.2 | 3.2 | 32 | 3.2 | 3.2 |
| OL-3 | 6.1 | 6.2 | 6.2 | 6.2 | 6.2 | 6.2 | 6.2 | 6.2 | 6.2 | 6.2 | 6.2 | 6.2 |
| OL-4 | 7.8 | 7.8 | 7.8 | 7.9 | 7.9 | 7.9 | 7.9 | 7.9 | 7.9 | 8.0 | 8.0 | 7.9 |
| OL-5 | 9.1 | 9.1 | 9.2 | 9.2 | 9.2 | 9.2 | 9.2 | 9.2 | 9.2 | 9.3 | 9.3 | 9.2 |
| OL-6 | 10.7 | 10.7 | 10.7 | 10.8 | 10.8 | 10.8 | 10.8 | 10.8 | 10.8 | 10.9 | 10.9 | 10.8 |
| OL-7 | 12.3 | 12.3 | 12.3 | 12.3 | 12.4 | 12.4 | 12.4 | 12.4 | 12.4 | 12.5 | 12.5 | 12.4 |
| OL-8 | 13.8 | 13.9 | 13.9 | 13.9 | 14.0 | 14.0 | 14.0 | 14.0 | 14.0 | 14.1 | 14.1 | 14.0 |

The display device DP1 of the present disclosure also have other properties related to the peak intensity ratio of the output spectrum. As shown in Table 2, a first sub-peak ratio of the sub-second intensity peak P2' to the second intensity peak P2 is in the range from 7.0% to 75.0%. As shown in Table 3, a second sub-peak ratio of the sub-second intensity peak P2' to the third intensity peak P3 is in the range from 12.0% to 89.0%. As shown in Table 4, a third sub-peak ratio of the second intensity peak P2 to the third intensity peak P3 is in the range from 119.0% to 162.0%. The values of the first sub-peak ratio, the second sub-peak ratio, and the third sub-peak ratio depend on the wavelength of the peaks, the characteristics of the light converting layers and any other related element(s) that form the display units DU1.

TABLE 2

The Data of the first sub-peak ratio for different samples

| P2'/P2 (%) | Peak (nm) | | | | | | | | | | | Ave (%) |
|---|---|---|---|---|---|---|---|---|---|---|---|---|
| | 527 | 528 | 529 | 530 | 531 | 532 | 533 | 534 | 535 | 536 | 537 | |
| OL-1 | 7.5 | 7.5 | 7.5 | 7.5 | 7.5 | 7.5 | 7.5 | 7.5 | 7.5 | 7.5 | 7.5 | 7.5 |
| OL-2 | 56.3 | 56.3 | 56.3 | 56.3 | 56.3 | 56.3 | 56.3 | 56.3 | 56.3 | 56.3 | 56.3 | 56.3 |
| OL-3 | 56.6 | 56.6 | 56.6 | 56.6 | 56.6 | 56.6 | 56.6 | 56.6 | 56.6 | 56.6 | 56.6 | 56.6 |
| OL-4 | 74.2 | 74.2 | 74.2 | 74.2 | 74.2 | 74.2 | 74.2 | 74.2 | 74.2 | 74.2 | 74.2 | 74.2 |

TABLE 3

The Data of the second sub-peak ratio for different samples

| P2'/P3 (%) | Peak (nm) | | | | | | | | | | | Ave (%) |
|---|---|---|---|---|---|---|---|---|---|---|---|---|
| | 527 | 528 | 529 | 530 | 531 | 532 | 533 | 534 | 535 | 536 | 537 | |
| OL-1 | 12.0 | 12.0 | 12.0 | 12.0 | 12.0 | 12.0 | 12.0 | 12.0 | 12.0 | 12.0 | 12.0 | 12.0 |
| OL-2 | 77.4 | 77.2 | 77.1 | 77.1 | 77.1 | 77.1 | 77.1 | 77.0 | 77.1 | 77.0 | 77.0 | 77.1 |
| OL-3 | 78.4 | 78.4 | 78.4 | 78.4 | 78.4 | 78.4 | 78.4 | 78.4 | 78.4 | 78.4 | 78.4 | 78.4 |
| OL-4 | 88.9 | 88.9 | 89.0 | 89.0 | 88.9 | 88.7 | 88.8 | 88.8 | 88.9 | 88.8 | 88.7 | 88.8 |

TABLE 4

The Data of the third sub-peak ratio for different samples

| P2/P3 (%) | Peak (nm) | | | | | | | | | | | Ave (%) |
|---|---|---|---|---|---|---|---|---|---|---|---|---|
| | 527 | 528 | 529 | 530 | 531 | 532 | 533 | 534 | 535 | 536 | 537 | |
| OL-1 | 161.1 | 161.2 | 161.2 | 161.5 | 161.2 | 160.8 | 161.1 | 160.9 | 160.8 | 160.9 | 160.4 | 161.0 |
| OL-2 | 137.4 | 137.3 | 137.0 | 137.1 | 137.1 | 137.3 | 137.1 | 136.8 | 137.0 | 136.9 | 137.1 | 137.1 |
| OL-3 | 138.5 | 138.5 | 138.6 | 138.6 | 138.6 | 138.5 | 138.6 | 138.5 | 138.5 | 138.6 | 138.6 | 138.6 |
| OL-4 | 119.8 | 119.8 | 119.9 | 119.9 | 119.8 | 119.6 | 119.7 | 119.7 | 119.8 | 119.7 | 119.5 | 119.7 |

Figure 7:
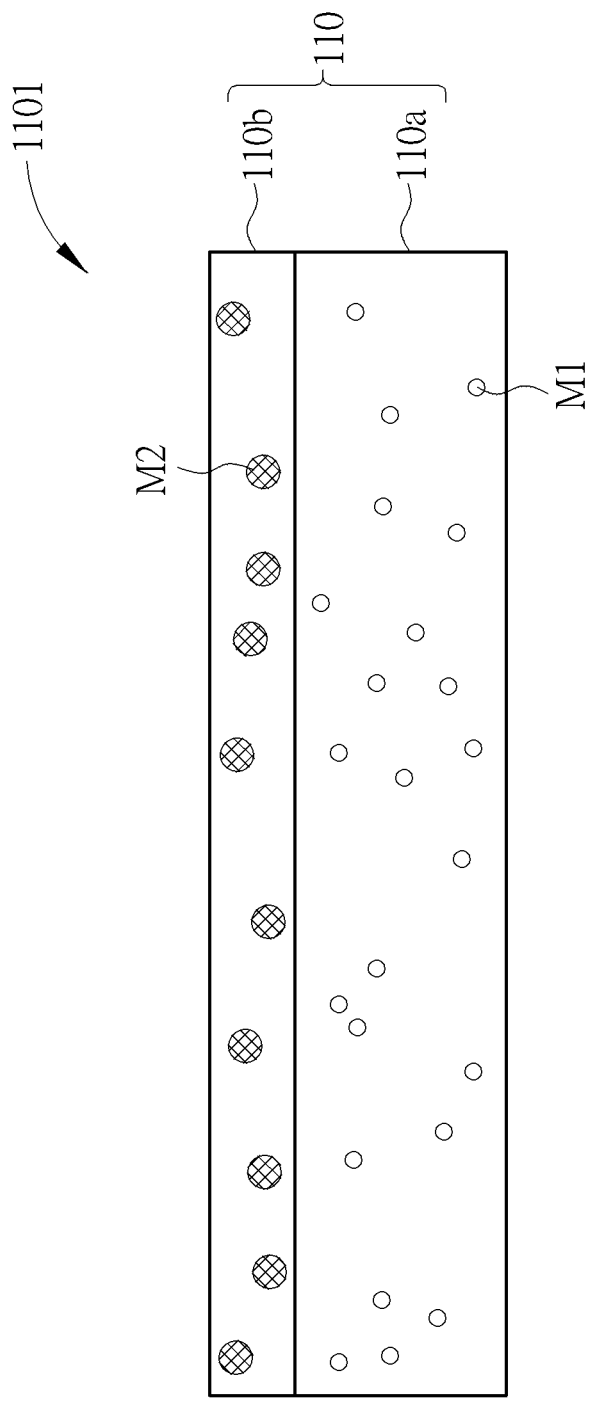
FIG. 7 is an enlarged schematic diagram illustrating a cross-sectional view of a partial light converting layer according to the first embodiment of the present disclosure.

Referring to FIG. 7, FIG. 7 is an enlarged schematic diagram illustrating a cross-sectional view of a partial light converting layer according to the first embodiment of the present disclosure. The light converting layer 110 may include mono-layer structure or a multilayer structure. In this embodiment, one of the first converting units 1101 of the light converting layer 110 shown in FIG. 7 includes at least two light-converting parts, which are the first light-converting part 110a and the second light-converting part 110b, and the materials included in the first light-converting part 110a and the second light-converting part 110b are non-identical. The first light-converting part 110a includes the color adjusting material M1. The color adjusting material M1 includes quantum dots that can convert the light emitted from the backlight module 200 into an output light having the output spectrum with maximum peak in the range from 494 nm to 575 nm for example, which may be called as green quantum-dot material hereinafter. The second light-converting part 110b disposed above the first light-converting part 110a includes the color adjusting material M2 that can adjust the output spectrum of the output light and make the output spectrum have at least one peak in a wavelength range from 380 nm to 493 nm or from 576 nm to 780 nm, wherein the color adjusting material M2 may include quantum dot material, pigment material or other suitable material. For example, the color adjusting material M2 includes one of yellowish quantum-dot material and bluish quantum-dot material, wherein the yellowish quantum-dot material is a color adjusting material which can convert the light emitted from the backlight module 200 into an output light having an output spectrum with one peak in a wavelength range from 576 nm to 780 nm, and the bluish quantum-dot material is a color adjusting material which can convert the light emitted from the backlight module 200 into an output light having an output spectrum with at least one peak in a wavelength range from 380 nm to 493 nm, but not limited thereto. In this embodiment, for example, the color adjusting material M2 may be yellowish quantum-dot material. In some other embodiment, both the first light-converting part 110a and the second light-converting part 110b include color adjusting materials, and the color adjusting material in one of the first light-converting part 110a and the second light-converting part 110b is different from the color adjusting material in another one of the first light-converting part 110a and the second light-converting part 110b.

Figure 8:
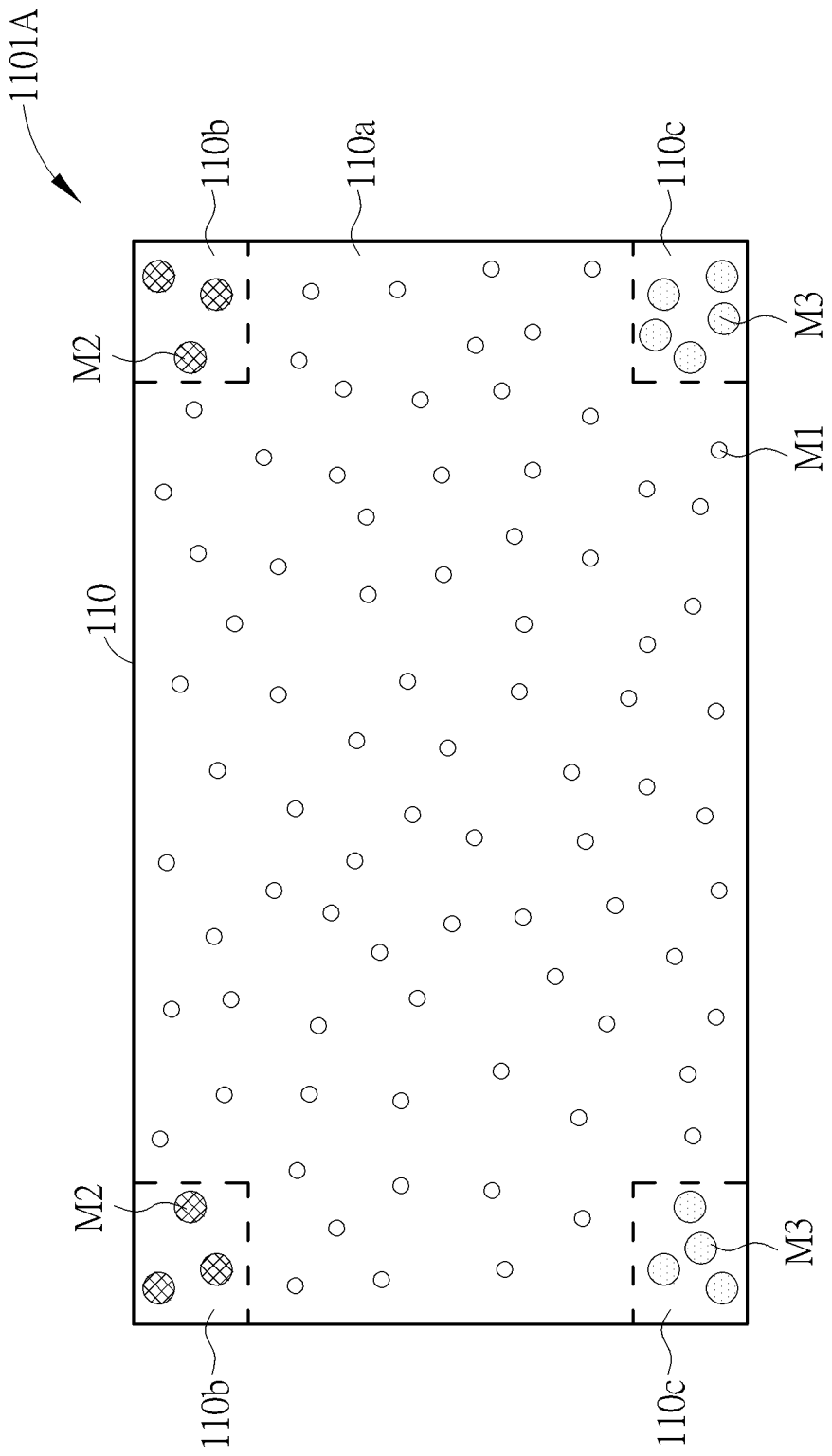
FIG. 8 is a schematic diagram illustrating a top view of a first variant structure of a first converting unit of the display device according to the first embodiment of the present disclosure.
Figure 9:
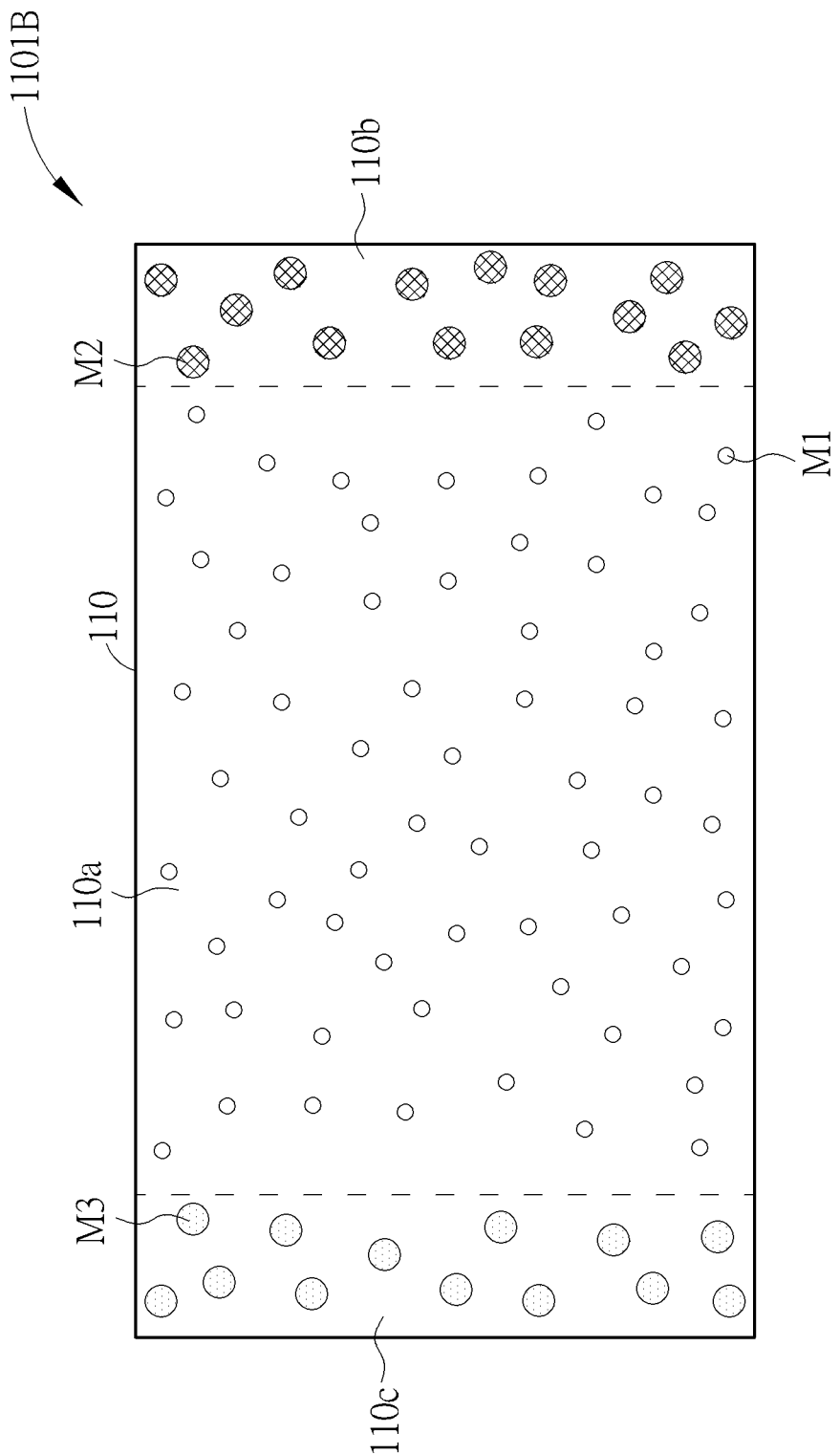
FIG. 9 is a schematic diagram illustrating a top view of a second variant structure of a first converting unit of the display device according to the first embodiment of the present disclosure.
Figure 10:
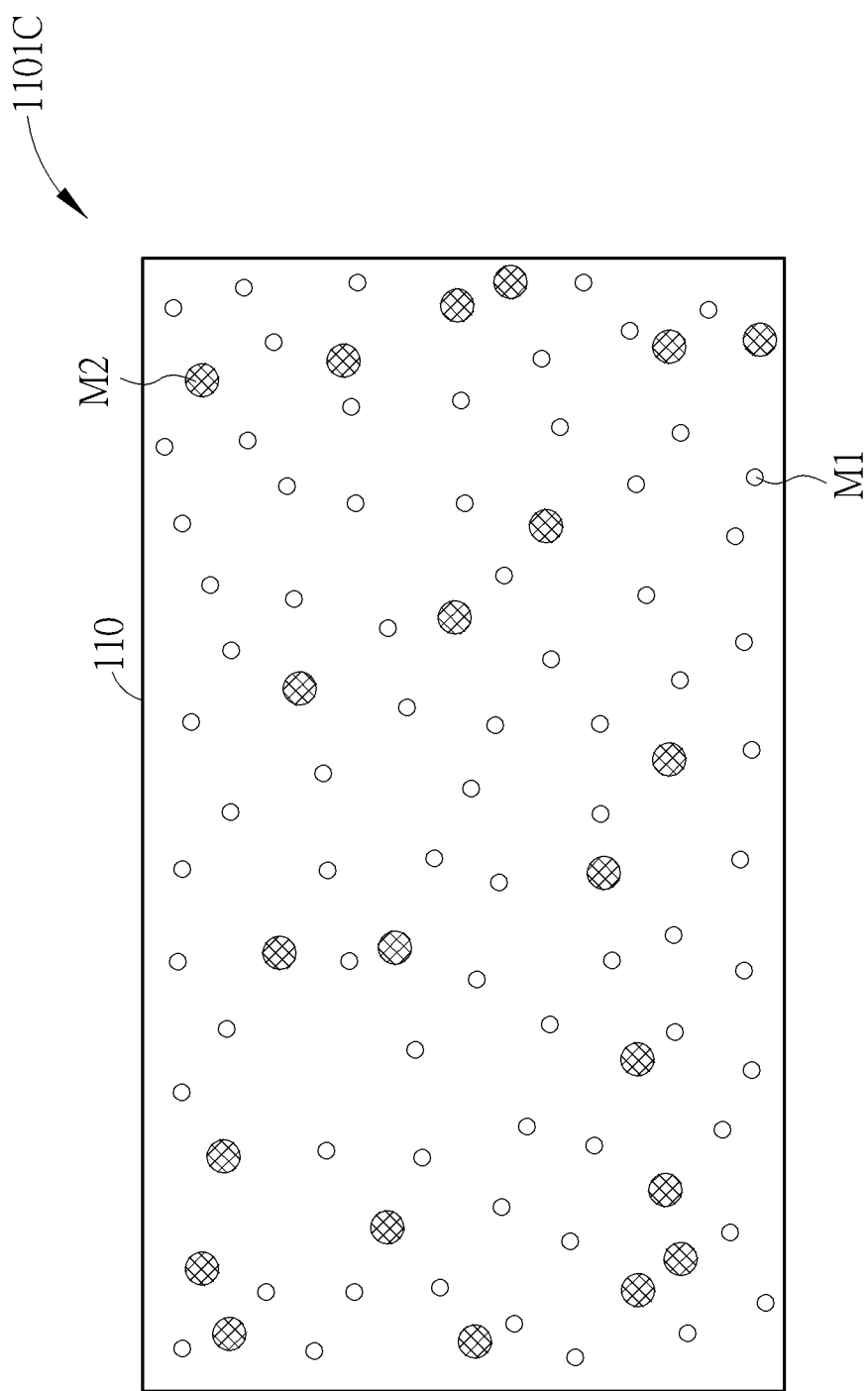
FIG. 10 is a schematic diagram illustrating a top view of a third variant structure of a first converting unit of the display device according to the first embodiment of the present disclosure.

Referring to FIG. 8 to FIG. 10, FIG. 8 is a schematic diagram illustrating a top view of a first variant structure of a first converting unit of the display device according to the first embodiment of the present disclosure, FIG. 9 is a schematic diagram illustrating a top view of a second variant structure of a first converting unit of the display device according to the first embodiment of the present disclosure, and FIG. 10 is a schematic diagrams illustrating a top view of a third variant structure of a first converting unit of the display device according to the first embodiment of the present disclosure. As shown in FIG. 8, one of the first converting units 1101A may include a plurality of parts, which are the first light-converting part 110a, the second light-converting parts 110b, and the third light-converting parts 110c. The second light-converting parts 110b and the third light-converting parts 110c are respectively disposed at the corners of the first converting unit 1101, and the first light-converting part 110a is the rest part of the first converting unit 1101 and has a greater area than the second light-converting parts 110b and the third light-converting parts 110c. The color adjusting material M1 in the first light-converting part 110a includes green quantum-dot material, the color adjusting material M2 in the second light-converting parts 110b includes yellowish quantum-dot material, the color adjusting material M3 in the third light light-converting parts 110c includes blueish quantum-dot material, but not limited thereto. As shown in FIG. 9, the main difference between the first converting unit 1101B and the first converting unit 1101A in FIG. 8 is that a single first converting unit 1101B only has a second light-converting part 110b and a third light-converting parts 110c, wherein the second light-converting 110b and the third light-converting parts 110c are disposed at opposite sides of the first light-converting parts 110a. As shown in FIG. 10, the first converting unit 1101C may be a green color filter with dopants or mixture of color converting material(s) or color adjusting material(s) mentioned-above mentioned, such as the color adjusting material M1 and the color adjusting material M2, but not limited thereto.

It should be noted that the above-mentioned first light-converting part 110a, the second light-converting part (s) 110b, and/or the third light-converting part(s) 110c may be a common part of two or more first converting units 1101, 1101A, 1101B, or 1101C of the display units DU'. In other words, two or more first converting units 1101, 1101A, 1101B, or 1101C may share the same films in the light converting layer 110.

Figure 11:
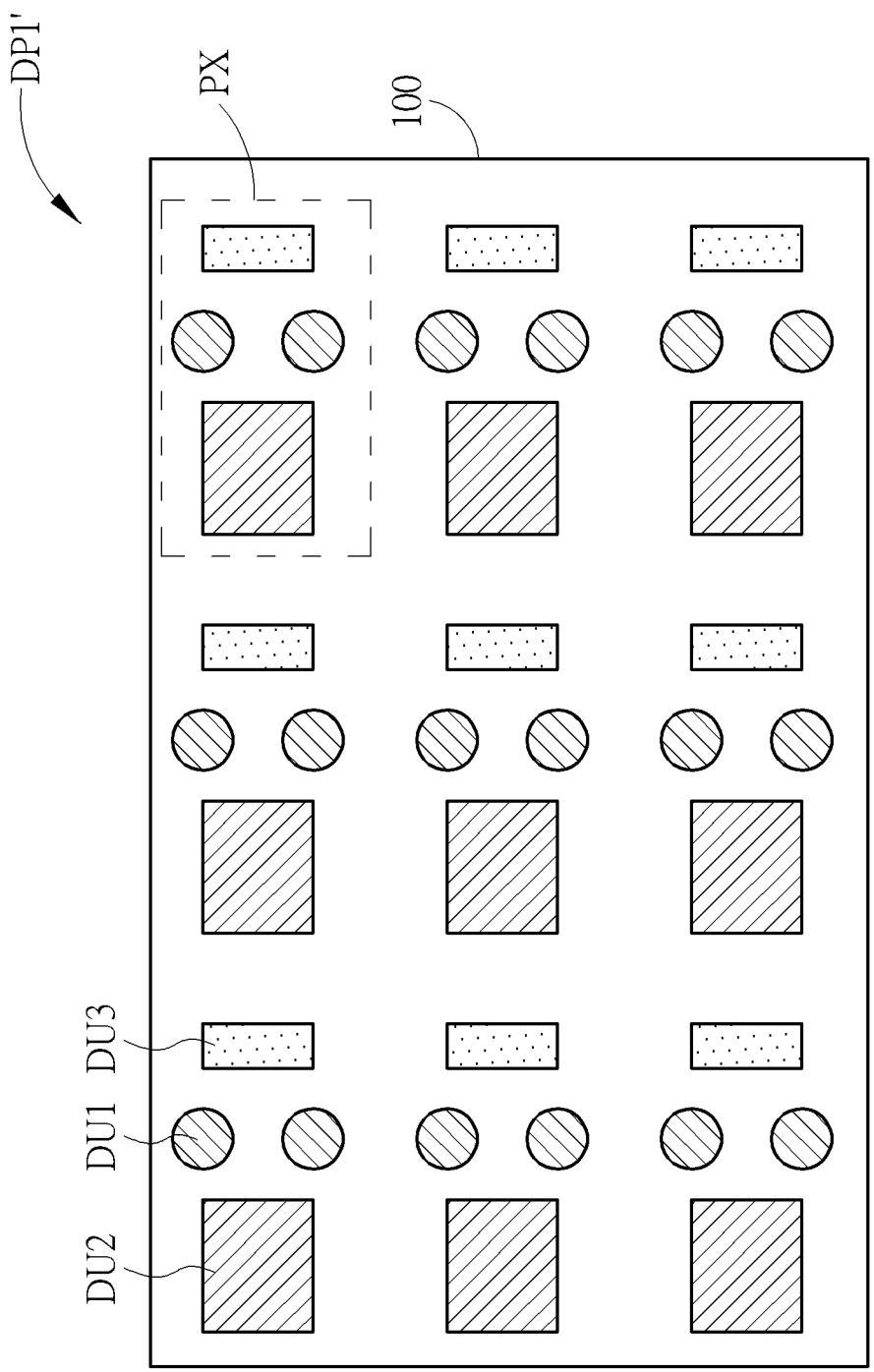
FIG. 11 is a top-view schematic diagram of an arrangement of the display units of the pixels of the display device according to a further variant embodiment of the first embodiment of the present disclosure.

Referring to FIG. 11, FIG. 11 is a schematic diagram of a top view of an arrangement of the display units of a display device according to a further variant embodiment of the first embodiment of the present disclosure. The arrangement of display units DU1, the display units DU2 and the display units DU3 of the display device DP1' of this variant embodiment is different from the arrangement of the first embodiment. In this variant embodiment, two of the display units DU1, one of the display units DU2 and one of the display units DU3 form a pixel PX, and two display units DU1 are disposed between the display unit DU2 and the display unit DU3 in one pixel PX. Moreover, the sizes of the display units DU1, the display units DU2 and the display units DU3 may be non-identical. In this variant embodiment, the size of the display units DU1 is smaller than the size of the display units DU3, and the size of the display units DU3 is smaller than the size of the display units DU2, but not limited thereto. In addition, the light-emitting shapes or the light-emitting areas of the display units DU1, the display units DU2 and the display units DU3 may be non-identical. For example, the light-emitting shapes of the display units DU1 are circular, the light-emitting shapes of the display units DU2 are rectangular, and the light-emitting shapes of the display units DU3 are stripe-shaped in this variant embodiment, but not limited thereto.

The display device of the present disclosure is not limited by the aforementioned embodiment and variant embodiments, and may have other different embodiments. To simplify the description, the identical components in each of the following embodiments are marked with identical symbols. For making it easier to compare the difference between the embodiments, the following description will detail the dissimilarities among different embodiments and the identical features will not be redundantly described.

Figure 12:
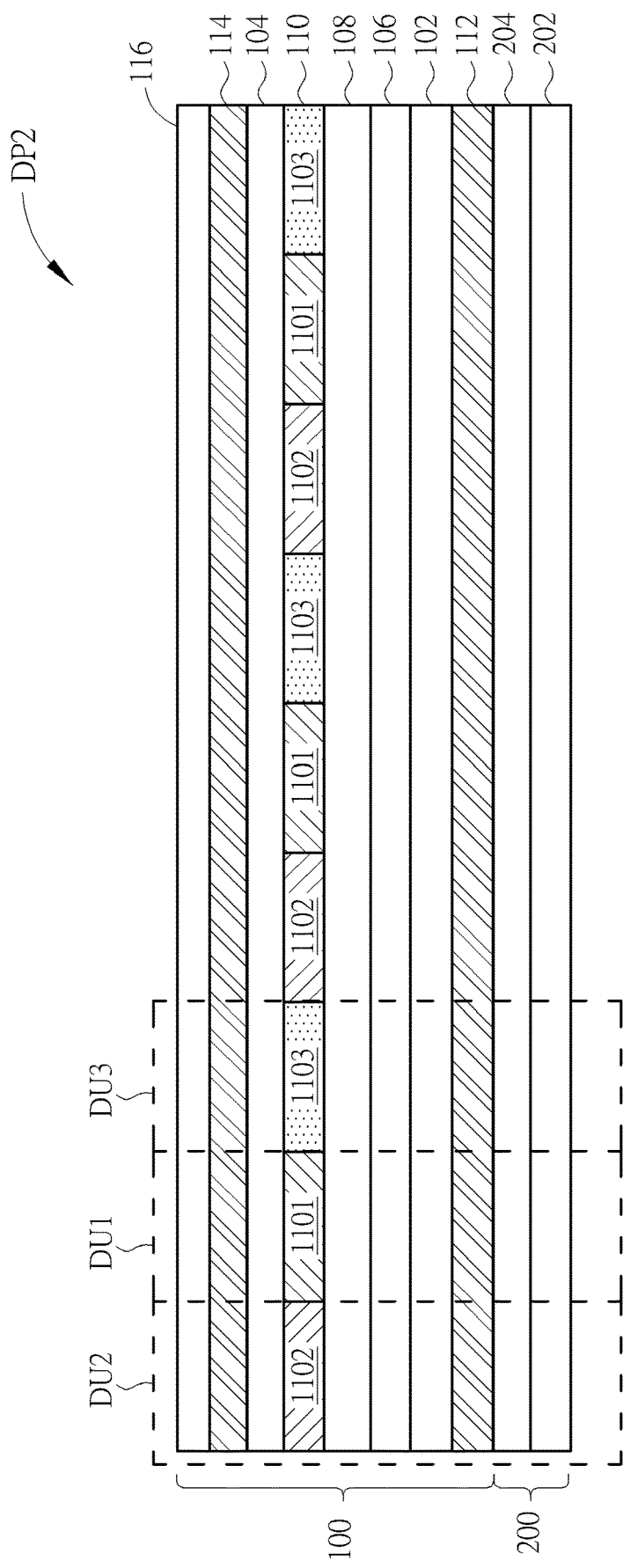
FIG. 12 is a schematic diagram of a cross-sectional view of a display device according to a second embodiment of the present disclosure.

Referring to FIG. 12, FIG. 12 is a schematic diagram of a cross-sectional view of a display device according to a second embodiment of the present disclosure. The difference between this embodiment and the first embodiment is that the backlight module 200 of the display device DP2 does not include the light converting layer 206 shown in FIG. 1. In this embodiment, the backlight unit 202 produces white light, and therefore the light converting layer 206 is not required. For the display units DU1 in the display device DP2 of this embodiment, the relative relation between the first intensity integral, the second intensity integral, and the third intensity integral in the output spectrum of the output light (such as the first ratio, the second ratio, and the third ratio mentioned above) and the relative relation between the intensity peaks of the output spectrum of the output light (such as the fourth ratio and the fifth ratio mentioned above) may be the same as described in the display device DP1 in the first embodiment. It should be noted that the other embodiments introduced in the following also have the same or similar relative relations of intensity integrals and intensity peaks of the output spectrum of the final output light of the display unit DU1 to the first embodiment, and will not be redundantly described.

Figure 13:
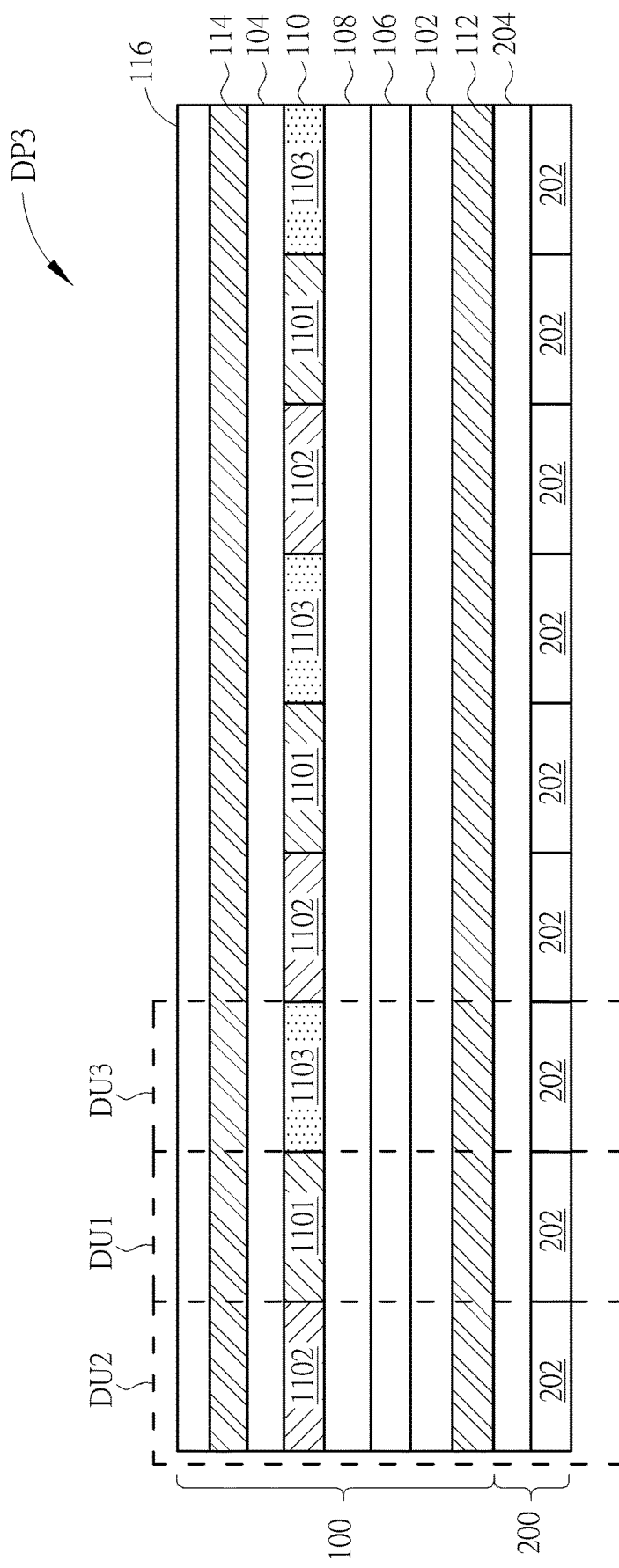
FIG. 13 is a schematic diagram of a cross-sectional view of a display device according to a third embodiment of the present disclosure.

Referring to FIG. 13, FIG. 13 is a schematic diagram of a cross-sectional view of a display device according to a third embodiment of the present disclosure. The difference between this embodiment and the first embodiment is that the backlight module 200 of the display device DP3 includes a plurality of backlight units 202. These backlight units 202 may include LEDs, mini-LEDs or micro-LEDs for instance. Light emitting diode (LED) is a chip with inorganic light emitting material for emitting light. Chip size of a normal LED is in a range from 400 μm to 2 mm. Chip size of a mini-LED is in a range from 50 μm to 400 μm. Chip size of a micro-LED is in a range from 1 μm to 50 μm. In this embodiment, each of the first display units DU1 includes one of the backlight units 202, a portion of the optical film 204, a portion of the first polarizer 112, a portion of the first substrate 102, a portion of the display circuit array 106, a portion of the light modulating layer 108, one of the first converting units 1101, a portion of the second substrate 104, a portion of the second polarizer 114, and a portion of the optical film 116.

Figure 14:
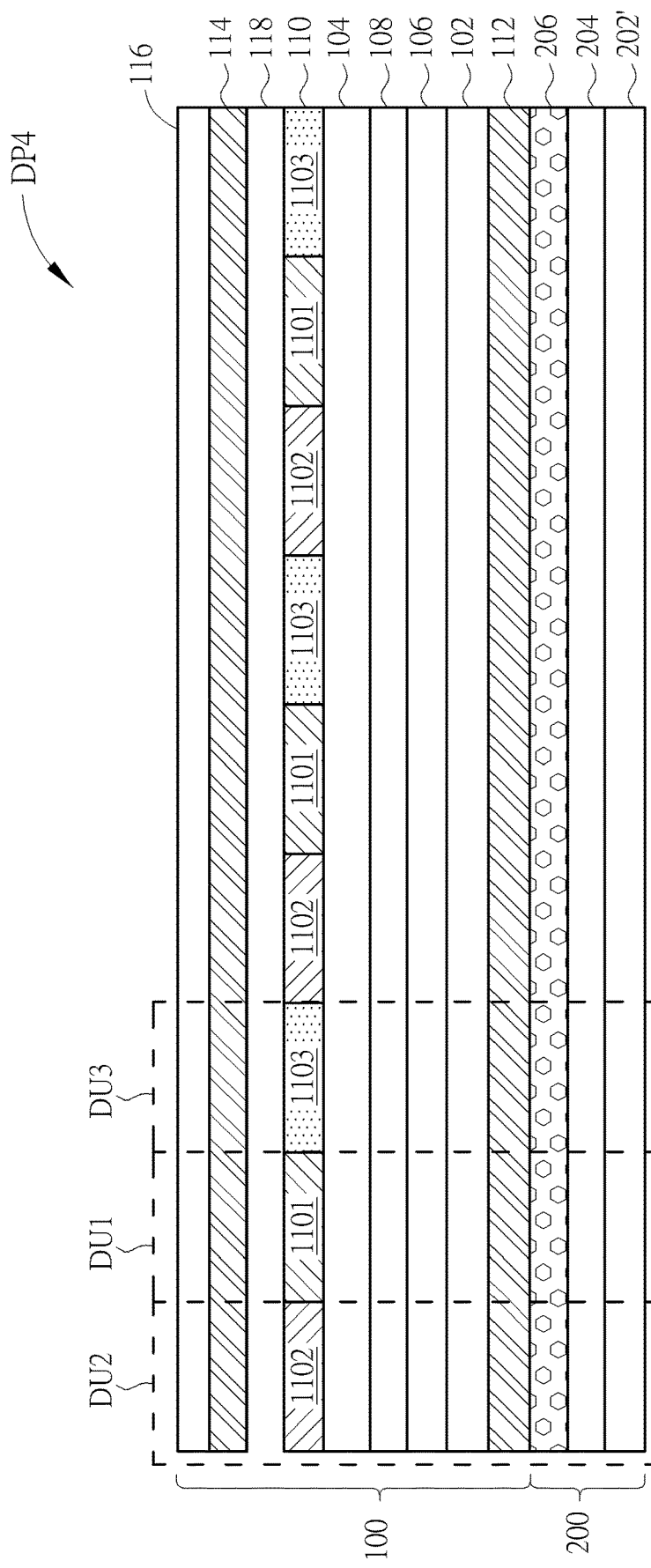
FIG. 14 is a schematic diagram of a cross-sectional view of a display device according to a fourth embodiment of the present disclosure.

Referring to FIG. 14, FIG. 14 is a schematic diagram of a cross-sectional view of a display device according to a fourth embodiment of the present disclosure. Compared with the first embodiment, the backlight module 200 of the display device DP4 includes a backlight unit 202' which produces blue light to replace the backlight unit 202 shown in FIG. 1, the second substrate 104 is disposed between the light modulating layer 108 and the light converting layer 110, and a third substrate 118 is disposed between the light converting layer 110 and the second polarizer layer 114. In this embodiment, the light converting layer 110 may be a quantum dot film or layer, wherein the first converting unit 1101 includes green quantum dot material that can covert blue light into green light, and the second converting unit 1102 includes red quantum dot material that can convert blue light into red light, while the third converting unit 1103 may not include quantum dot material therein, but not limited thereto.

Figure 15:
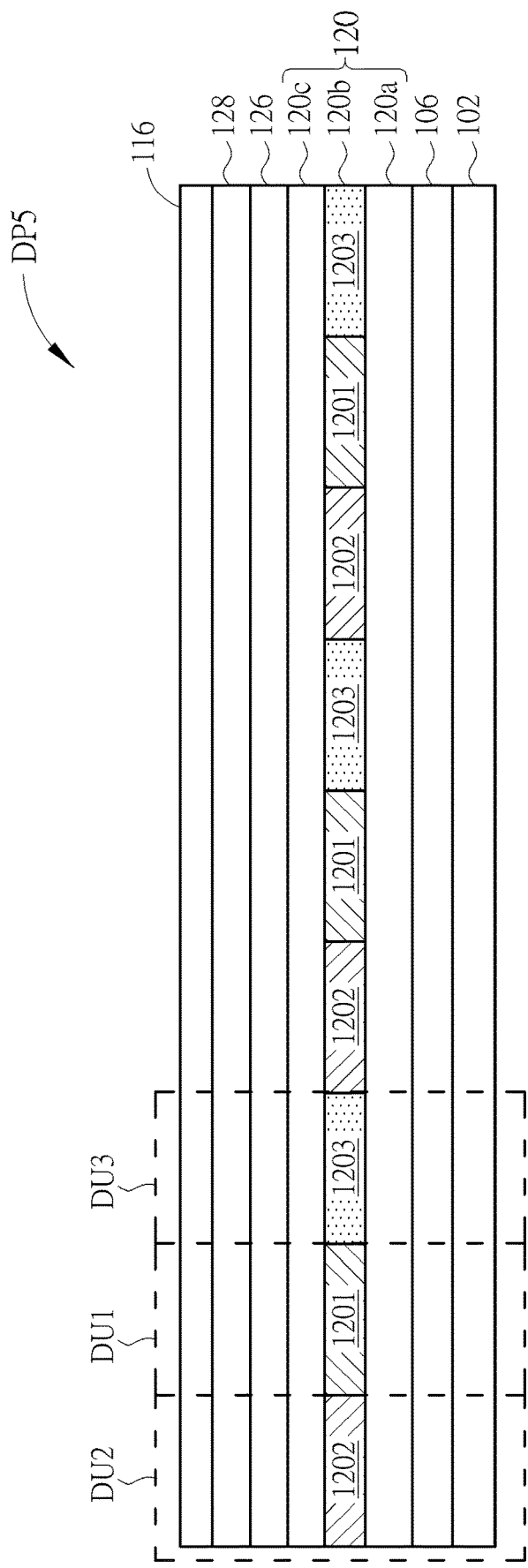
FIG. 15 is a schematic diagram of a cross-sectional view of a display device according to a fifth embodiment of the present disclosure.

Referring to FIG. 15, FIG. 15 is a schematic diagram of a cross-sectional view of a display device according to a fifth embodiment of the present disclosure. As shown in FIG. 15, the display device DP5 of this embodiment is an organic light-emitting display (OLED) device and includes a first substrate 102, a display circuit array 106 for driving, a light source layer 120, a capping layer 126, a barrier film 128 and an optical film 116, wherein the capping layer 126, the barrier film 128, and the optical film 116 are optional and may be replaced by other layers or films. In this embodiment, the light source layer 120 is disposed on the display circuit array 106 and electrically connected to a circuit of the display circuit array 106. The light source layer 120 includes an anode layer 120*a*, a light emitting layer 120*b*, and a cathode layer 120*c*. The light emitting layer 120*b* includes organic light emitting materials and is composed of a plurality of first emitting units 1201, a plurality of second emitting units 1202, and a plurality of third emitting units 1203 that respectively produce light with different spectrums, which means these three kinds of emitting units respectively produce different color lights. For example, the first emitting units 1201 produce green light that has a spectrum with a maximum peak between 490 nm and 575 nm of wavelength; the second emitting units 1202 produce blue light that has a spectrum with a maximum peak between 380 nm and 490 nm of wavelength; and the third emitting units 1203 produce red light that has a spectrum with a maximum peak between 580 nm and 780 nm of wavelength, but not limited thereto. Each of the first emitting units 1201 and the corresponding portions of the anode layer 120*a* and the cathode layer 120*c* form a light source; each of the second emitting units 1202 and the corresponding portions of the anode layer 120*a* and the cathode layer 120*c* form a light source; and each of the third emitting units 1203 and the corresponding portions of the anode layer 120*a* and the cathode layer 120*c* form a light source. In this embodiment, each of the display units DU1 includes a portion of the first substrate 102, a portion of the display circuit array 106 (such as a circuit of the display circuit array 106), a portion of the light source layer 120 (a light source with one of the first emitting units 1201), a portion of the capping layer 126, a portion of the barrier film 128, and a portion of the optical film 116. The configuration of the display units DU2 and DU3 may have similar structures but including different emitting units, wherein the display units DU2 and the display units DU3 respectively include one of the second emitting units 1202 and one of the third emitting units 1203. The display units DU1, DU2, DU3 of the display device DP5 may further include other related elements, films or layers, such as a related portion of insulating layer or a related portion of encapsulation layer, but not limited thereto. In this embodiment, the first emitting units 1201 include one or more color adjusting material, wherein the color adjusting material in the first emitting units 1201 makes the output spectrum of the output light have at least one maximum peak between 380 nm and 493 nm of wavelength or between 576 nm and 780 nm of wavelength. It should be noted that the output light could be regarded as the final visual light of the display unit DU1 of the display device to the observer, and an output spectrum of the output light is measured out of the display device.

Figure 16:
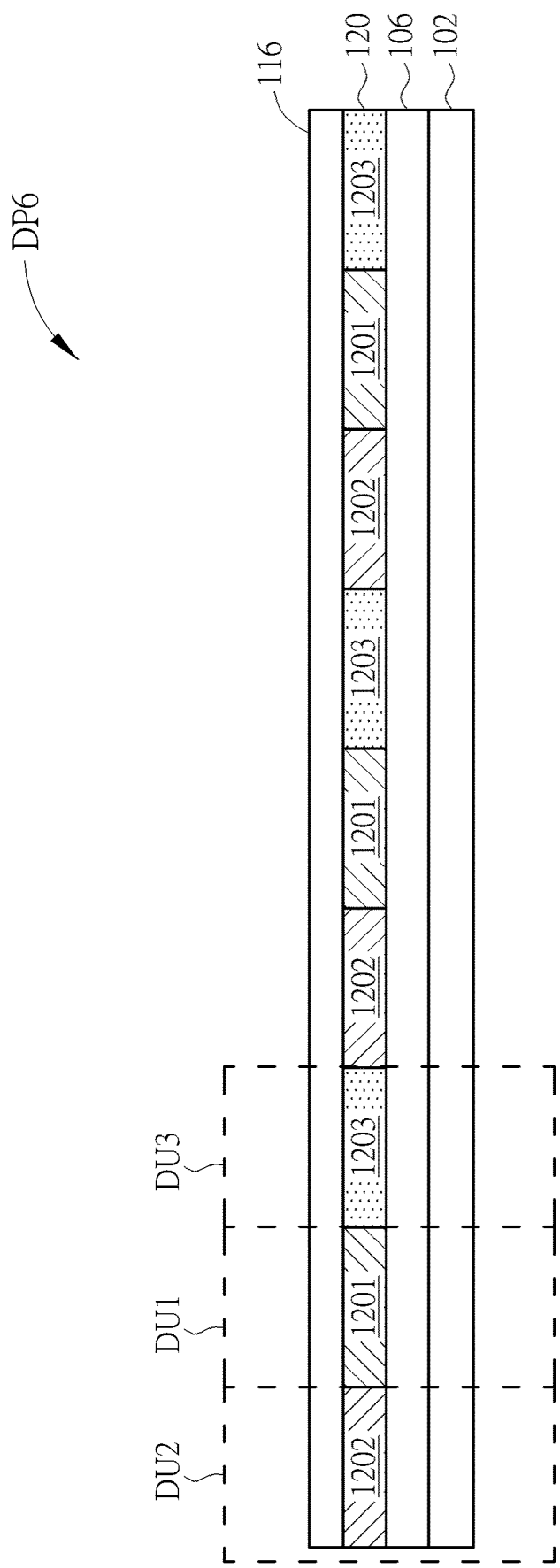
FIG. 16 is a schematic diagram of a cross-sectional view of a display device according to a sixth embodiment of the present disclosure.

Referring to FIG. 16, FIG. 16 is a schematic diagram of a cross-sectional view of a display device according to a sixth embodiment of the present disclosure. Compared with the fifth embodiment, the first emitting units 1201, the second emitting units 1202, and the third emitting units 1203 of the light source layer 120 in the display device DP6 respectively include a quantum-dot light emitting diode (QLED) with quantum dot mixed organic light emitting material that produces light with different spectrum. For example, the QLEDs in the first emitting units 1201 produce green light, the QLEDs in the second emitting units 1202 produce blue light, the QLEDs in the third emitting units 1203 produce red light in this embodiment. Each of the first emitting units 1201 includes one or more color adjusting material that makes the output spectrum of the output light have at least one maximum peak between 380 nm and 493 nm or between 576 nm and 780 nm of wavelength. In this embodiment, each display unit DU1 includes a light source in the light source layer 120 (i.e. one of the first emitting units 1201), each display unit DU2 includes a light source in the light source layer 120 (i.e. one of the second emitting units 1202), and each display unit DU3 includes a light source in the light source layer 120 (i.e. one of the third emitting units 1203). Moreover, each of the display units DU1, DU2, DU3 further includes a portion of the first substrate 102, a portion of the display circuit array 106 (such as a circuit), and a portion of the optical film 116. The cathode layer, the anode layer, the optional barrier layer, and the optional capping layer are not shown redundantly.

Figure 17:
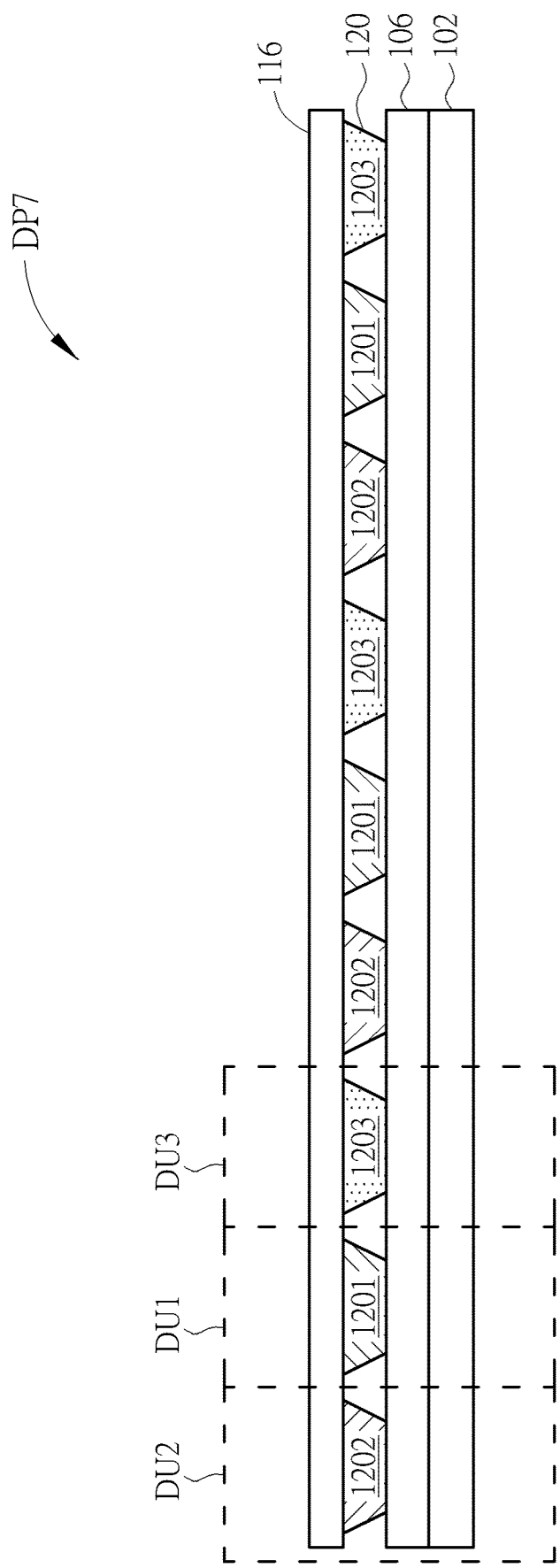
FIG. 17 is a schematic diagram of a cross-sectional view of a display device according to a seventh embodiment of the present disclosure.

Referring to FIG. 17, FIG. 17 is a schematic diagram of a cross-sectional view of a display device according to a seventh embodiment of the present disclosure. Compared with the sixth embodiment, the first emitting units 1201, the second emitting units 1202, and the third emitting units 1203 in the display device DP7 are respectively replaced by a micro light emitting diode (μ-LED) or mini light emitting diode (mini-LED) that produces light with different spectrum. Chip size of a mini-LED is in a range from 50 μm to 400 μm. Chip size of a micro-LED is in a range from 1 μm to 50 μm. The first emitting units 1201 include color adjusting material which may be similar to the color adjusting material in the sixth embodiment of the present disclosure and will not be redundantly described. In this embodiment, each display unit DU1 includes a light source in the light source layer 120 (i.e. one of the first emitting units 1201), each display unit DU2 includes a light source in the light source layer 120 (i.e. one of the second emitting units 1202), and each display unit DU3 includes a light source in the light source layer 120 (i.e. one of the third emitting units 1203). Moreover, each of the display units DU1, DU2, DU3 further includes a portion of the first substrate 102, a portion of the display circuit array 106, and a portion of the optical film 116.

Figure 18:
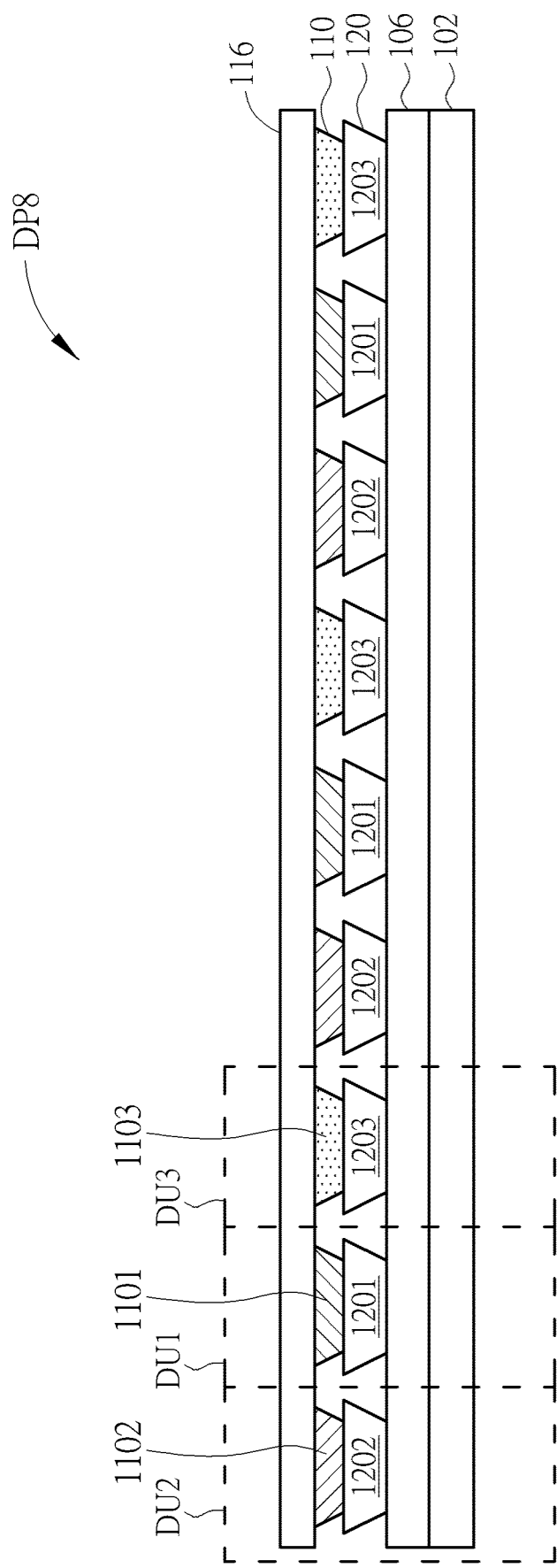
FIG. 18 is a schematic diagram of a cross-sectional view of a display device according to an eighth embodiment of the present disclosure.

Referring to FIG. 18, FIG. 18 is a schematic diagram of a cross-sectional view of a display device according to an eighth embodiment of the present disclosure. Compared with the seventh embodiment, the μ-LEDs (or mini-LEDs) of the light source layer 120 in this embodiment produce light with the same spectrum or with the same color and may not include color adjusting material. Moreover, the display device DP8 in this embodiment further includes a light converting layer 110 disposed between the light source layer 120 and the optical film 116. The light converting layer 110 may be disposed on a side of the light sources of the light source layer 120 opposite to the first substrate 102 for converting and adjusting the spectrum and/or color of the light emitted from the light sources of the light source layer 120. The light converting layer 110 of this embodiment includes first converting units 1101, second converting units 1102 and third converting units 1103 arranged side by side.

The lights emitted out of the first emitting units 1201, the second emitting units 1202, and the third emitting units 1203 of the light source layer 120 may be blue light, and the light converting layer 110 may include color filter material, quantum dot material, phosphor material, pigment material or a combination of two or more of the above-mentioned materials. The first converting units 1101 include material that can covert blue light into green light, and the third converting units 1103 include material that can convert blue light into red light, while the second converting units 1102 may not include color converting material therein or may include material that can adjust the spectrum of blue light, but not limited thereto. In this embodiment, the first converting units 1101 further include color adjusting material that makes the output spectrum of the output light have at least one maximum peak between 380 nm and 493 nm of wavelength or between 576 nm and 780 nm of wavelength, which is similar to the first embodiment and will not be redundantly described. In this embodiment, each display unit DU1 includes a portion of the first substrate 102, a portion of the display circuit array 106, a portion of the light source layer 120 (i.e. the first emitting unit 1201), a first converting unit 1101, and a portion of the optical film 116. The configurations of the display units DU2 and DU3 are similar. However, the display units DU2 include the second emitting units 1202 and the second converting units 1102, and the display units DU3 include the third emitting units 1203 and the third converting units 1103.

Figure 19:
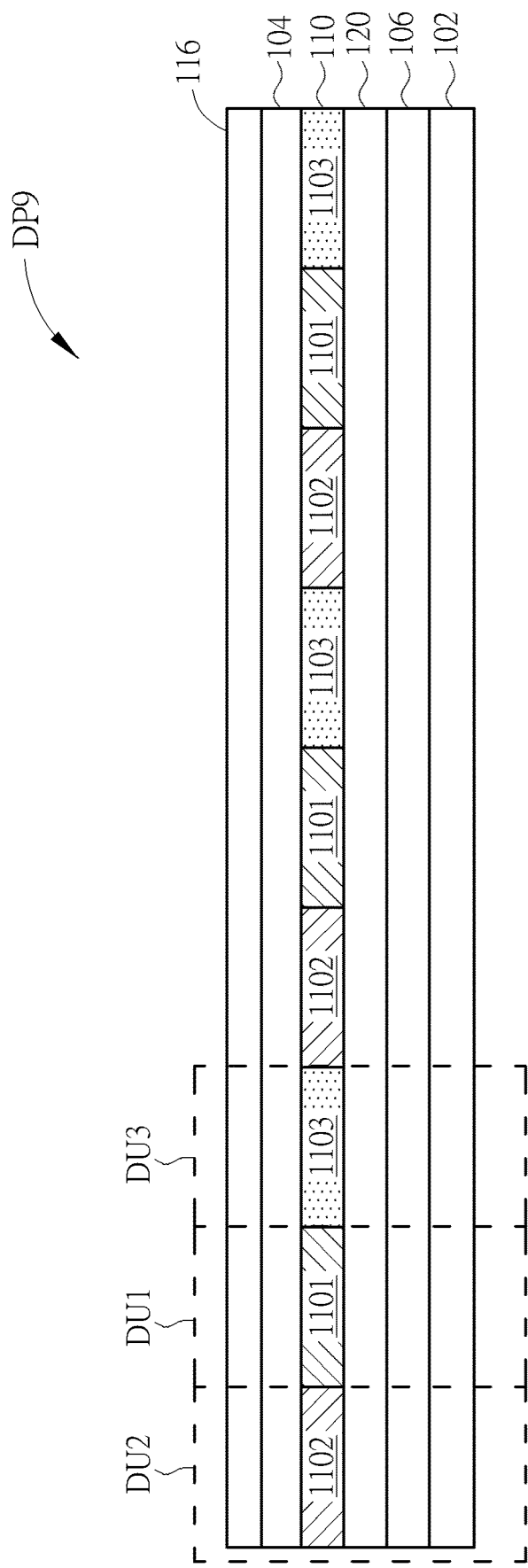
FIG. 19 is a schematic diagram of a cross-sectional view of a display device according to a ninth embodiment of the present disclosure.

Referring to FIG. 19, FIG. 19 is a schematic diagram of a cross-sectional view of a display device according to a ninth embodiment of the present disclosure. Compared with the fifth embodiment, the organic light-emitting material of the light sources of the light source layer 120 of the display device DP9 in this embodiment emit blue light and does not include color adjusting material. Furthermore, the material and function of the light converting layer 110 of the display device DP9 may refer to the eighth embodiment. The light converting layer 110 is disposed on a side of the light source layer 120 opposite to the first substrate 102. In this embodiment, the first converting units 1101 includes the color adjusting material that makes the output spectrum of the output light have at least one maximum peak between 380 nm and 493 nm of wavelength or between 576 nm and 780 nm of wavelength, which is similar to the first embodiment and will not be redundantly described. In this embodiment, each display unit DU1 includes a portion of the light converting layer 110 (i.e. one of the first converting units 1101), each display unit DU2 includes a portion of the light converting layer 110 (i.e. one of the second converting units 1102), and each display unit DU3 includes a portion of the light converting layer 110 (i.e. one of the third emitting units 1103). Moreover, each of the display units DU1, DU2, DU3 further includes a portion of the first substrate 102, a portion of the display circuit array 106, a portion of the light source layer 120, a portion of the second substrate 104 and a portion of the optical film 116 respectively.

Figure 20:
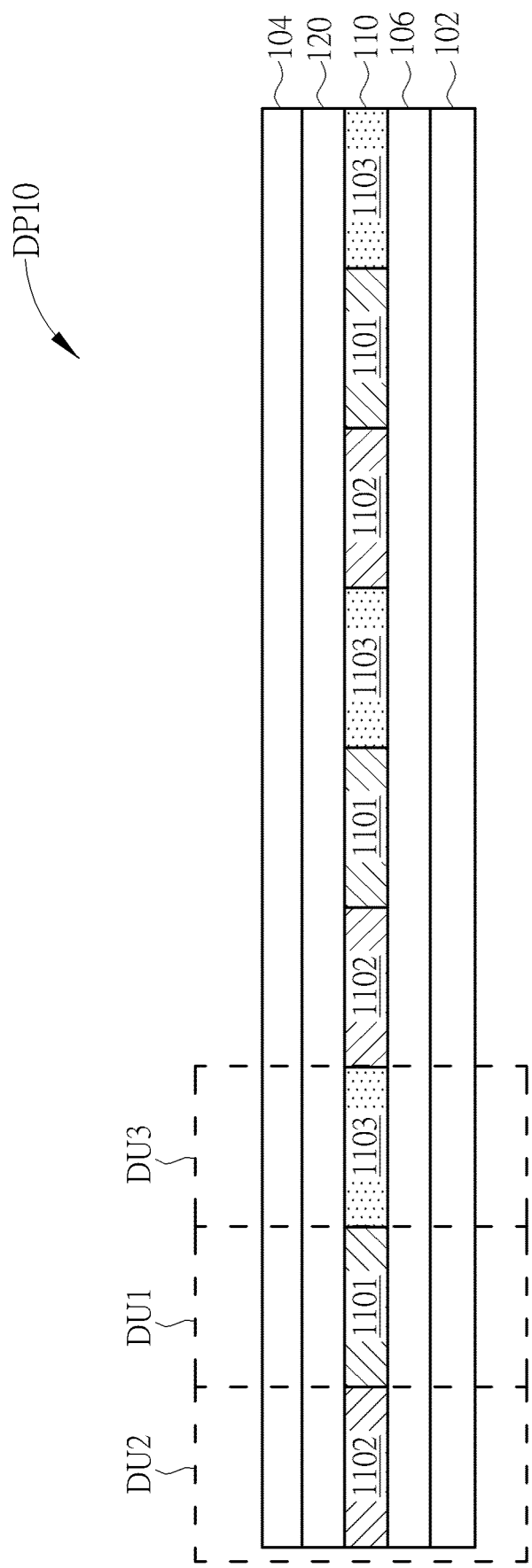
FIG. 20 is a schematic diagram of a cross-sectional view of a display device according to a tenth embodiment of the present disclosure.

Referring to FIG. 20, FIG. 20 is a schematic diagram of a cross-sectional view of a display device according to a tenth embodiment of the present disclosure. Compared with the fifth embodiment, the light source layer 120 of the display device DP10 in this embodiment emits white light, and the second substrate 104 and the light converting layer 110 is disposed at two sides of the light source layer 120, wherein the light converting layer 110 is disposed between the display circuit array 106 and the light source layer 120, and the second substrate 104 is disposed at a side of the light source layer 120 opposite to the light converting layer 110.

It should be noted that the light emitted out of the light source layer 120 may be reflected by the second substrate 104 to propagate downward in FIG. 20, which means the side of the first substrate 102 opposite to the second substrate 104 is the display side of the display device DP10. In this embodiment, each of the first converting units 1101 includes the color adjusting material that makes the output spectrum of the output light have at least one maximum peak between 380 nm and 493 nm of wavelength or between 576 nm and 780 nm of wavelength, which is similar to the first embodiment and will not be redundantly described. Each display unit DU1 includes a portion of the light converting layer 110 (i.e. one of the first converting units 1101), each display unit DU2 includes a portion of the light converting layer 110 (i.e. one of the second converting units 1102), and each display unit DU3 includes a portion of the light converting layer 110 (i.e. one of the third emitting units 1103). Moreover, each of the display units DU1, DU2, DU3 further includes a portion of the first substrate 102, a portion of the display circuit array 106, a portion of the light source layer 120 and a portion of the second substrate 104.

To summarize, for the display unit that produces green output light, a specific spectrum profile of the green output light corresponding to a highest gray level is provided according to the display device of the present disclosure. A ratio of the summation of the intensity integral of the output spectrum from 380 nm to 493 nm and from 576 nm to 780 nm to the intensity integral of the output spectrum from 380 nm to 493 nm is greater than 0.0% and less than or equal to 37.0%. A ratio of the maximum peak of the output spectrum between 380 nm and 493 nm to the maximum peak of the output spectrum between 494 nm and 575 nm is greater than 1.0% and less than or equal to 15.0%. This spectrum profile of the output light of the display unit for producing green light may be provided by disposing, adjusting or designing any elements or layers included by the display unit, such as disposing light converting layer or color adjusting material in the color filter or in the emitting unit of the light source, but not limited thereto. For example, the color adjusting material included in the light converting layer or in the light source of the display unit can make the output spectrum of the output light of the display unit may have at least one maximum peak between 380 nm and 493 nm of wavelength or between 576 nm and 780 nm of wavelength, and therefore to properly modify the ratio of the intensity integral of the output spectrum in the range from 380 nm to 493 nm and/or from 576 nm to 780 nm to the output spectrum in the range from 494 nm to 575 nm. Therefore, the output green light of the display unit in the display device of the present disclosure corresponding to a highest gray level can meet the Rec. 2020 standard and provide high perception to the M size cone cells of human eyes at the same time. Accordingly, the perception experience of the uses is improved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device, comprising:
    a display unit emitting a green output light having an output spectrum corresponding to a highest gray level of the display device,
    wherein a first maximum peak between 380 nm and 493 nm of the output spectrum is defined as a first intensity peak, a secondary maximum peak between 380 nm and 493 nm of the output spectrum is defined as a second intensity peak, and a first sub-peak ratio of the second intensity peak to the first intensity peak is in a range from 7.0% to 75.0%, wherein the first intensity peak corresponds to a first wavelength of the output spectrum, the second intensity peak corresponds to a second wavelength of the output spectrum, and the first wavelength is greater than the second wavelength;

wherein an intensity integral of the output spectrum from 494 nm to 575 nm is defined as a first intensity integral, an intensity integral of the output spectrum from 380 nm to 493 nm is defined as a second intensity integral, and the first intensity integral is greater than double of the second intensity integral.

2. The display device of claim 1, wherein a maximum peak between 576 nm and 780 nm of the output spectrum is defined as a third intensity peak, and a second sub-peak ratio of the second intensity peak to the third intensity peak is in a range from 12.0% to 89.0%.

3. The display device of claim 1, further comprising:
a first substrate;
a second substrate disposed opposite to the first substrate;
a light modulating layer disposed between the first substrate and the second substrate; and
a backlight module disposed adjacent to the first substrate, wherein the display unit comprises a portion of the first substrate, a portion of the second substrate, a portion of the light modulating layer, and a portion of the backlight module.

4. The display device of claim 3, further comprising a light converting layer, wherein the light converting layer is disposed between the backlight module and the first substrate, disposed on a surface of the second substrate opposite to the light modulating layer, or disposed between the second substrate and the light modulating layer, and the display unit further comprises a portion of the light converting layer.

5. The display device of claim 4, wherein the light converting layer comprises a quantum dot material, a color filter, a phosphor material, or a pigment material.

6. The display device of claim 5, wherein the quantum dot material comprises one of yellowish quantum-dot material and bluish quantum-dot material.

7. The display device of claim 1, further comprising:
a first substrate;
a light source layer disposed on the first substrate; and
a light converting layer disposed on the light source layer, wherein the display unit comprises a portion of the first substrate, a portion of the light source layer, and a portion of the light converting layer.

8. The display device of claim 7, wherein the light source layer comprises an organic light-emitting diode (OLED), a micro light emitting diode (μ-LED) or a mini light emitting diode (mini-LED).

9. The display device of claim 7, wherein the light source layer emits blue light.

10. A display device, comprising:
a display unit emitting a green output light having an output spectrum corresponding to a highest gray level of the display device,
wherein a first maximum intensity between 380 nm and 493 nm of the output spectrum is defined as a first intensity value, a secondary maximum intensity between 380 nm and 493 nm of the output spectrum is defined as a second intensity value, a maximum intensity between 576 nm and 780 nm of the output spectrum is defined as a third intensity value, and a third sub-peak ratio of the second intensity value to the third intensity value is in a range from 12.0% to 89.0%;

wherein the first intensity value corresponds to a first wavelength of the output spectrum, the second intensity value corresponds to a second wavelength of the output spectrum, and the first wavelength is greater than the second wavelength;

wherein an intensity integral of the output spectrum from 494 nm to 575 nm is defined as a first intensity integral, an intensity integral of the output spectrum from 380 nm to 493 nm is defined as a second intensity integral, and the first intensity integral is greater than double of the second intensity integral.

11. The display device of claim 10, further comprising:
a first substrate;
a second substrate disposed opposite to the first substrate;
a light modulating layer disposed between the first substrate and the second substrate; and
a backlight module disposed adjacent to the first substrate, wherein the display unit comprises a portion of the first substrate, a portion of the second substrate, a portion of the light modulating layer, and a portion of the backlight module.

12. The display device of claim 11, further comprising a light converting layer, wherein the light converting layer is disposed between the backlight module and the first substrate, disposed on a surface of the second substrate opposite to the light modulating layer, or disposed between the second substrate and the light modulating layer, and the display unit further comprises a portion of the light converting layer.

13. The display device of claim 12, wherein the light converting layer comprises a quantum dot material, a color filter, a phosphor material, or a pigment material.

14. The display device of claim 13, wherein the quantum dot material comprises one of yellowish quantum-dot material and bluish quantum-dot material.

15. The display device of claim 10, further comprising:
a first substrate;
a light source layer disposed on the first substrate; and
a light converting layer disposed on the light source layer, wherein the display unit comprises a portion of the first substrate, a portion of the light source layer, and a portion of the light converting layer.

16. The display device of claim 15, wherein the light source layer comprises an organic light-emitting diode (OLED), a micro light emitting diode (μ-LED) or a mini light emitting diode (mini-LED).

17. The display device of claim 15, wherein the light source layer emits blue light.

18. A display device, comprising:
a display unit emitting a green output light having an output spectrum corresponding to a highest gray level of the display device,
wherein a first maximum peak between 380 nm and 493 nm of the output spectrum is defined as a first intensity peak, a secondary maximum peak between 380 nm and 493 nm of the output spectrum is defined as a second intensity peak, a maximum peak between 576 nm and 780 nm of the output spectrum is defined as a third intensity peak, and a ratio of the first intensity peak to the third intensity peak is in a range from 119% to 162%;

wherein the first intensity peak corresponds to a first wavelength of the output spectrum, the second intensity peak corresponds to a second wavelength of the output spectrum, and the first wavelength is greater than the second wavelength;

wherein an intensity integral of the output spectrum from 494 nm to 575 nm is defined as a first intensity integral, an intensity integral of the output spectrum from 380 nm to 493 nm is defined as a second intensity integral, and the first intensity integral is greater than double of the second intensity integral.

19. The display device of claim 1, wherein an intensity of the first intensity peak is greater than an intensity of the secondary intensity peak.

20. The display device of claim 10, wherein the first intensity value is greater than the secondary intensity value.

* * * * *